(12) United States Patent
Oh et al.

(10) Patent No.: US 9,165,774 B2
(45) Date of Patent: Oct. 20, 2015

(54) SEMICONDUCTOR DEVICE AND METHOD OF MANUFACTURING THE SAME

(71) Applicant: SK hynix Inc., Gyeonggi-do (KR)

(72) Inventors: Sung Lae Oh, Chungcheongbuk-do (KR); Jin Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/163,839

(22) Filed: Jan. 24, 2014

(65) Prior Publication Data

US 2015/0041903 A1    Feb. 12, 2015

(30) Foreign Application Priority Data

Aug. 12, 2013    (KR) .................. 10-2013-0095504

(51) Int. Cl.
*H01L 27/115*    (2006.01)
*H01L 21/28*    (2006.01)

(52) U.S. Cl.
CPC ..... *H01L 21/28008* (2013.01); *H01L 27/11548* (2013.01); *H01L 27/11575* (2013.01)

(58) Field of Classification Search
CPC ............. H01L 22/26; H01L 1/31053; H01L 21/31111; H01L 27/11529; H01L 27/11548; H01L 27/11551; H01L 27/11556; H01L 27/11573; H01L 27/11575; H01L 27/11578; H01L 27/11582; H01L 27/0207; H01L 27/0688; H01L 27/1157; H01L 27/105; H01L 29/78; H01L 27/088; H01L 21/28008; G11C 16/10
See application file for complete search history.

(56) References Cited

U.S. PATENT DOCUMENTS

| | | | | |
|---|---|---|---|---|
| 2008/0099819 A1* | 5/2008 | Kito et al. | ...................... | 257/315 |
| 2008/0253183 A1* | 10/2008 | Mizukami et al. | ........ | 365/185.05 |
| 2008/0265235 A1* | 10/2008 | Kamigaichi et al. | ............. | 257/2 |
| 2009/0001419 A1* | 1/2009 | Han et al. | ...................... | 257/190 |
| 2010/0096682 A1* | 4/2010 | Fukuzumi et al. | ............ | 257/314 |
| 2011/0169071 A1* | 7/2011 | Uenaka et al. | ................ | 257/326 |
| 2011/0169072 A1* | 7/2011 | Lim et al. | ...................... | 257/329 |
| 2011/0180941 A1* | 7/2011 | Hwang et al. | ................ | 257/786 |
| 2011/0284943 A1* | 11/2011 | Hwang et al. | ................ | 257/314 |
| 2012/0070944 A1* | 3/2012 | Kim et al. | ...................... | 438/128 |
| 2012/0273872 A1* | 11/2012 | Lim et al. | ...................... | 257/329 |
| 2012/0286345 A1* | 11/2012 | Seo et al. | ...................... | 257/315 |
| 2012/0322252 A1* | 12/2012 | Son et al. | ...................... | 438/591 |

(Continued)

FOREIGN PATENT DOCUMENTS

| | | |
|---|---|---|
| KR | 1020100097459 | 9/2010 |
| KR | 1020100123462 | 11/2010 |

(Continued)

*Primary Examiner* — Jarrett Stark
*Assistant Examiner* — Bitew Dinke
(74) *Attorney, Agent, or Firm* — IP & T Group LLP

(57) ABSTRACT

A semiconductor device includes a plurality of transistors formed over a substrate, a support body including a horizontal portion and protrusions, wherein the horizontal portion covers at least one of the transistors, and the protrusions are formed over the horizontal portion and located between the transistors, and conductive layers and insulating layers alternately stacked over the support body and protruding upwardly along the sidewalls of the protrusions.

11 Claims, 40 Drawing Sheets

(56) References Cited

U.S. PATENT DOCUMENTS

| | | | |
|---|---|---|---|
| 2013/0017629 A1* | 1/2013 | Pyo et al. | 438/16 |
| 2013/0020647 A1* | 1/2013 | Hwang et al. | 257/365 |
| 2013/0032875 A1* | 2/2013 | Yun et al. | 257/324 |
| 2013/0099306 A1* | 4/2013 | Choi et al. | 257/329 |
| 2013/0279256 A1* | 10/2013 | Costa et al. | 365/185.17 |
| 2014/0021632 A1* | 1/2014 | LEE et al. | 257/774 |
| 2014/0110795 A1* | 4/2014 | OH et al. | 257/401 |
| 2014/0183756 A1* | 7/2014 | HWANG et al. | 257/774 |
| 2014/0286095 A1* | 9/2014 | HISHIDA et al. | 365/185.05 |

FOREIGN PATENT DOCUMENTS

| | | |
|---|---|---|
| KR | 1020110010045 | 1/2011 |
| KR | 1020110021444 | 3/2011 |
| KR | 101054554 | 8/2011 |
| KR | 1020110121360 | 11/2011 |
| KR | 1020130007885 | 1/2013 |

* cited by examiner

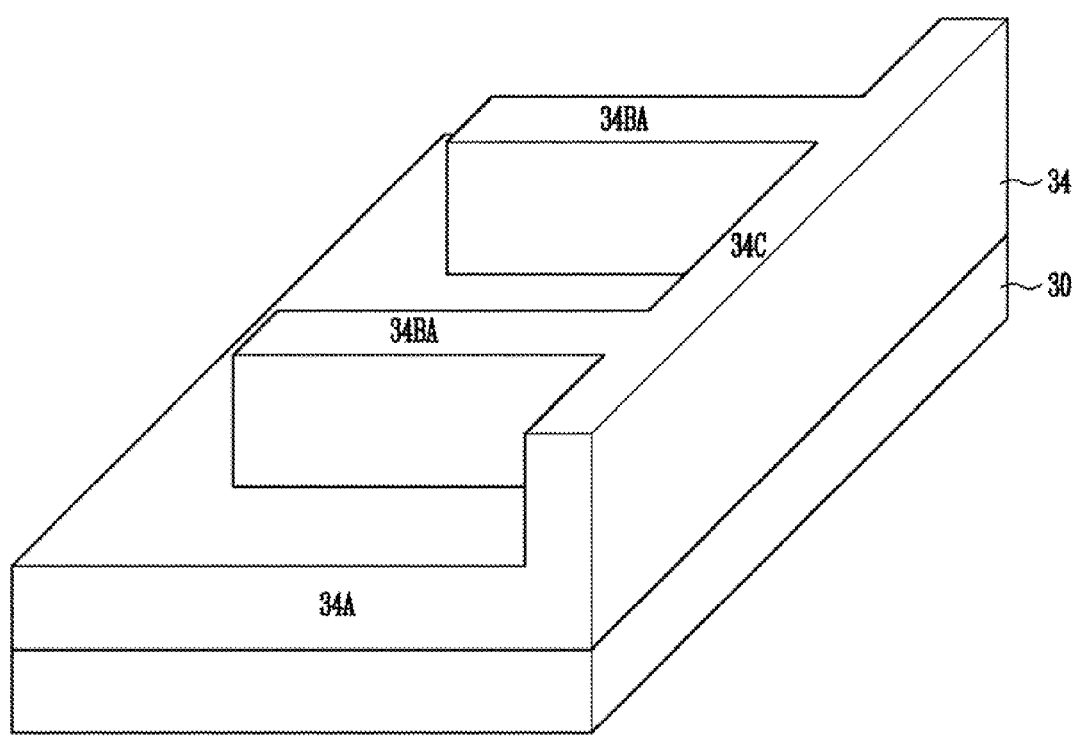

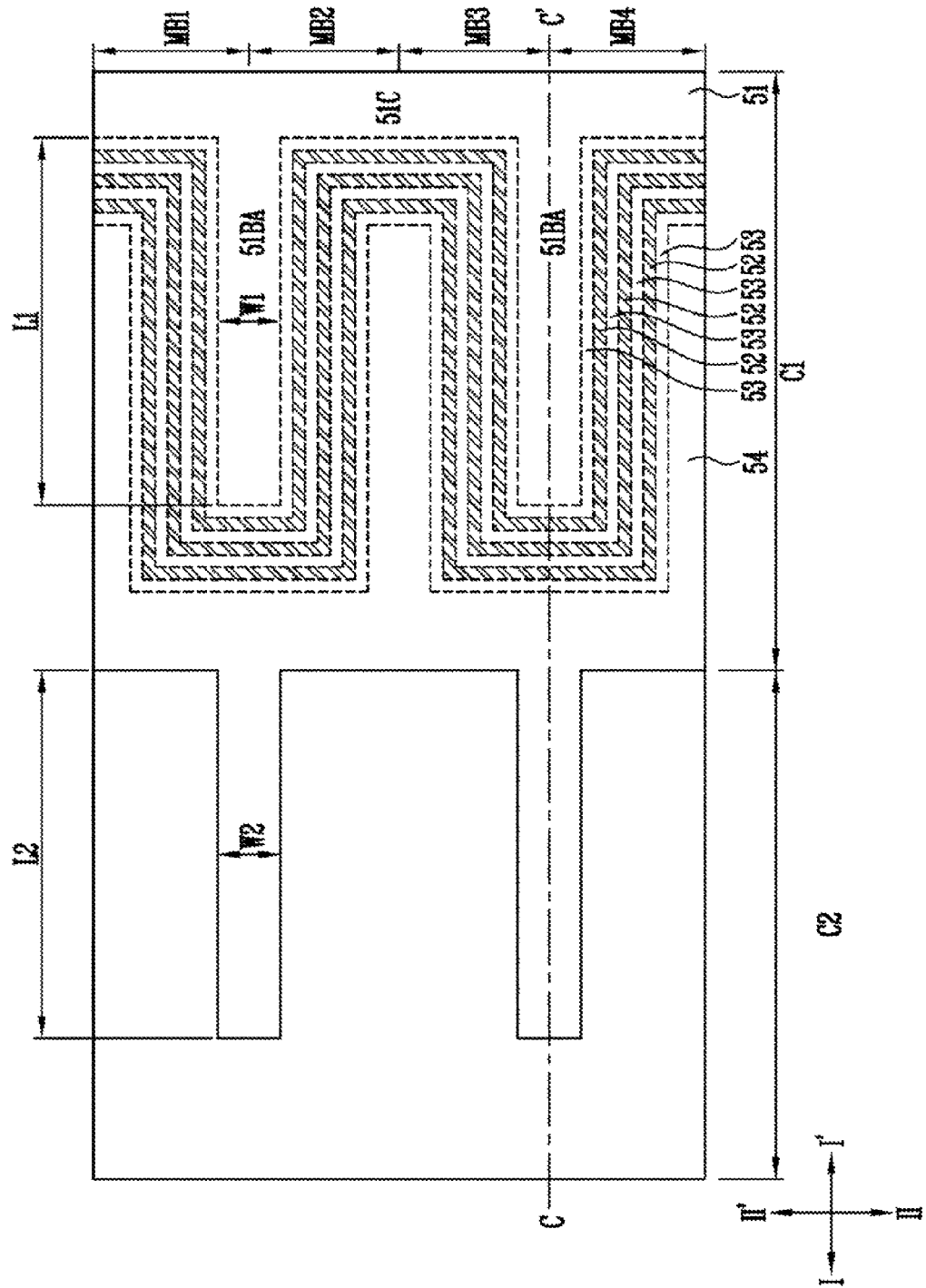

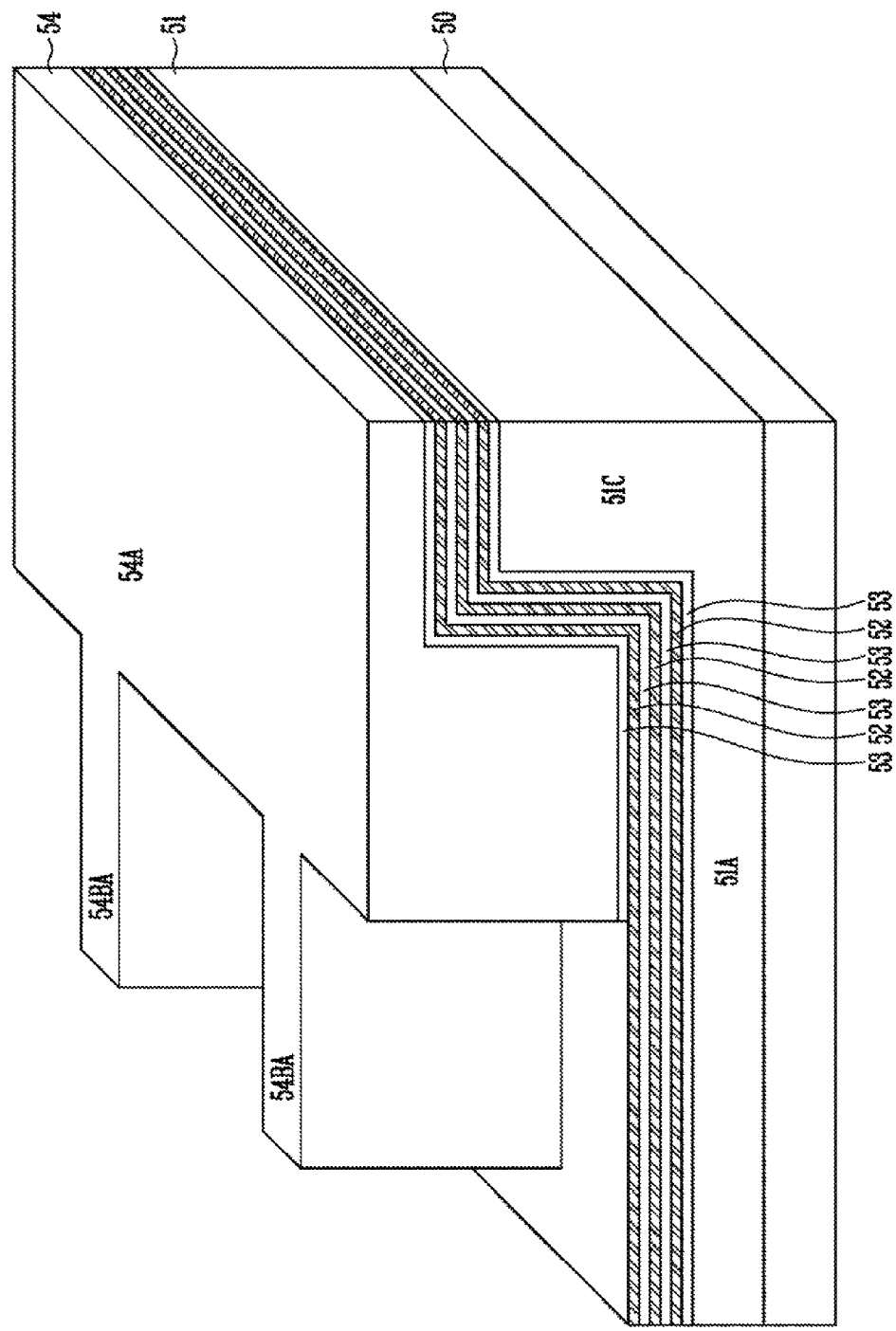

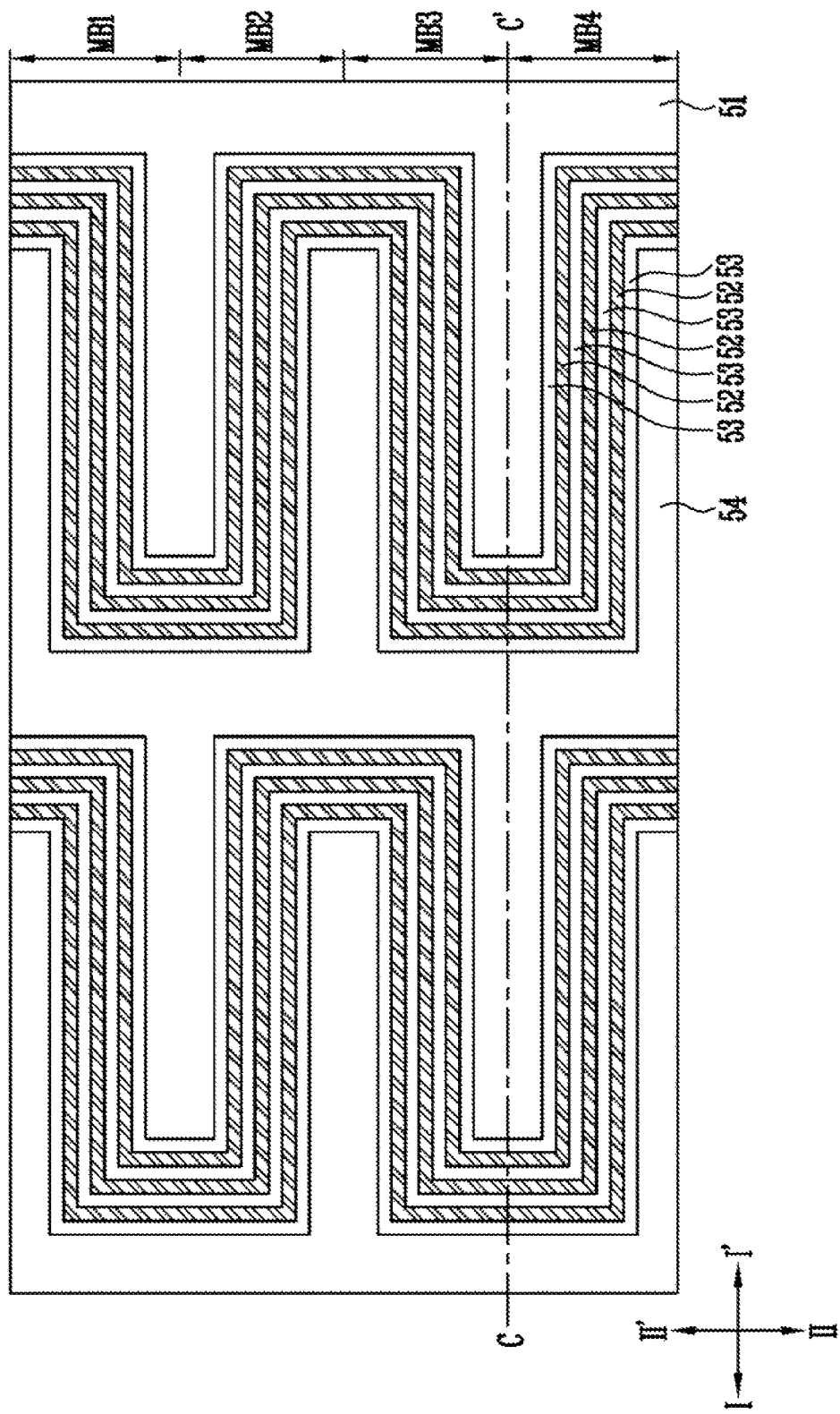

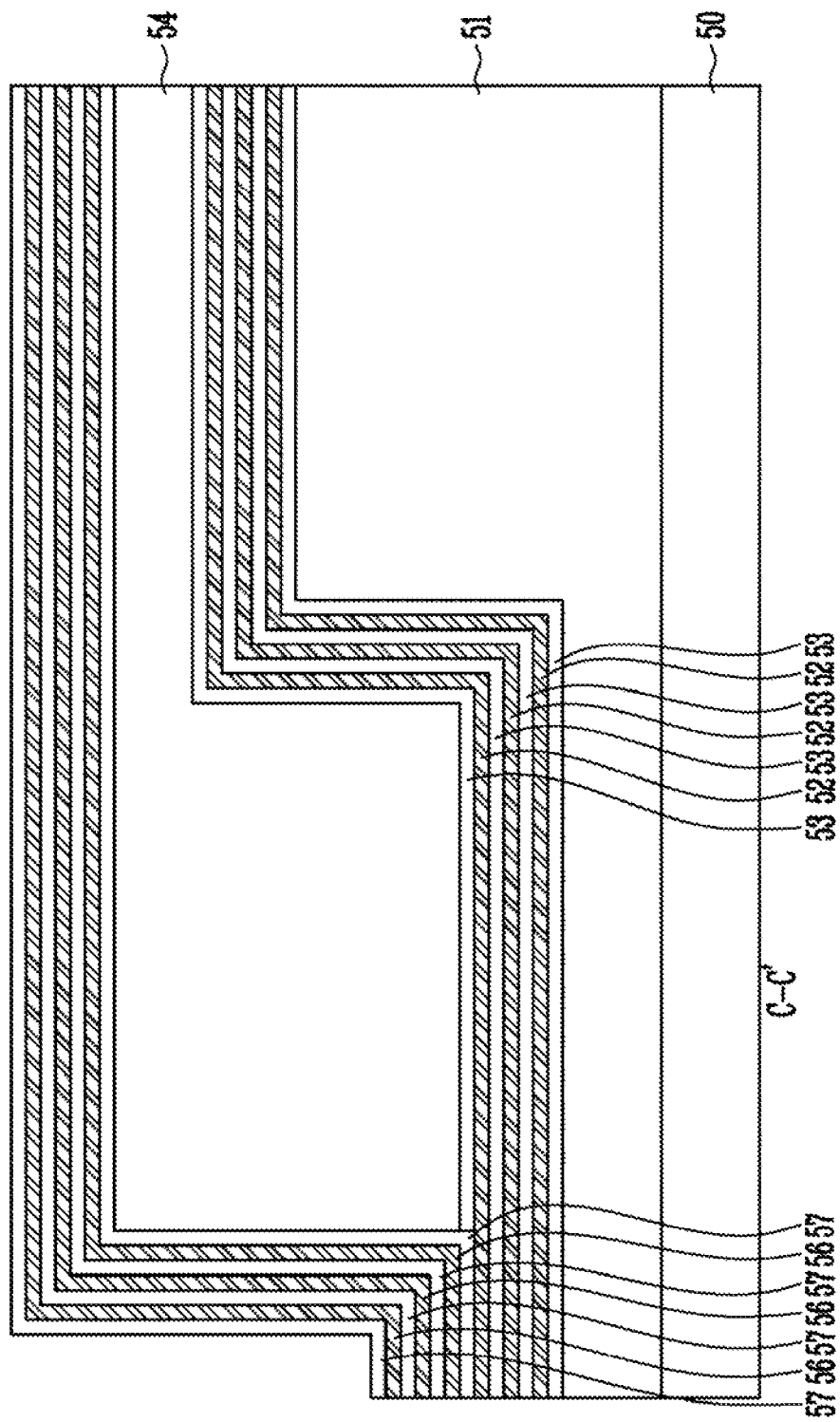

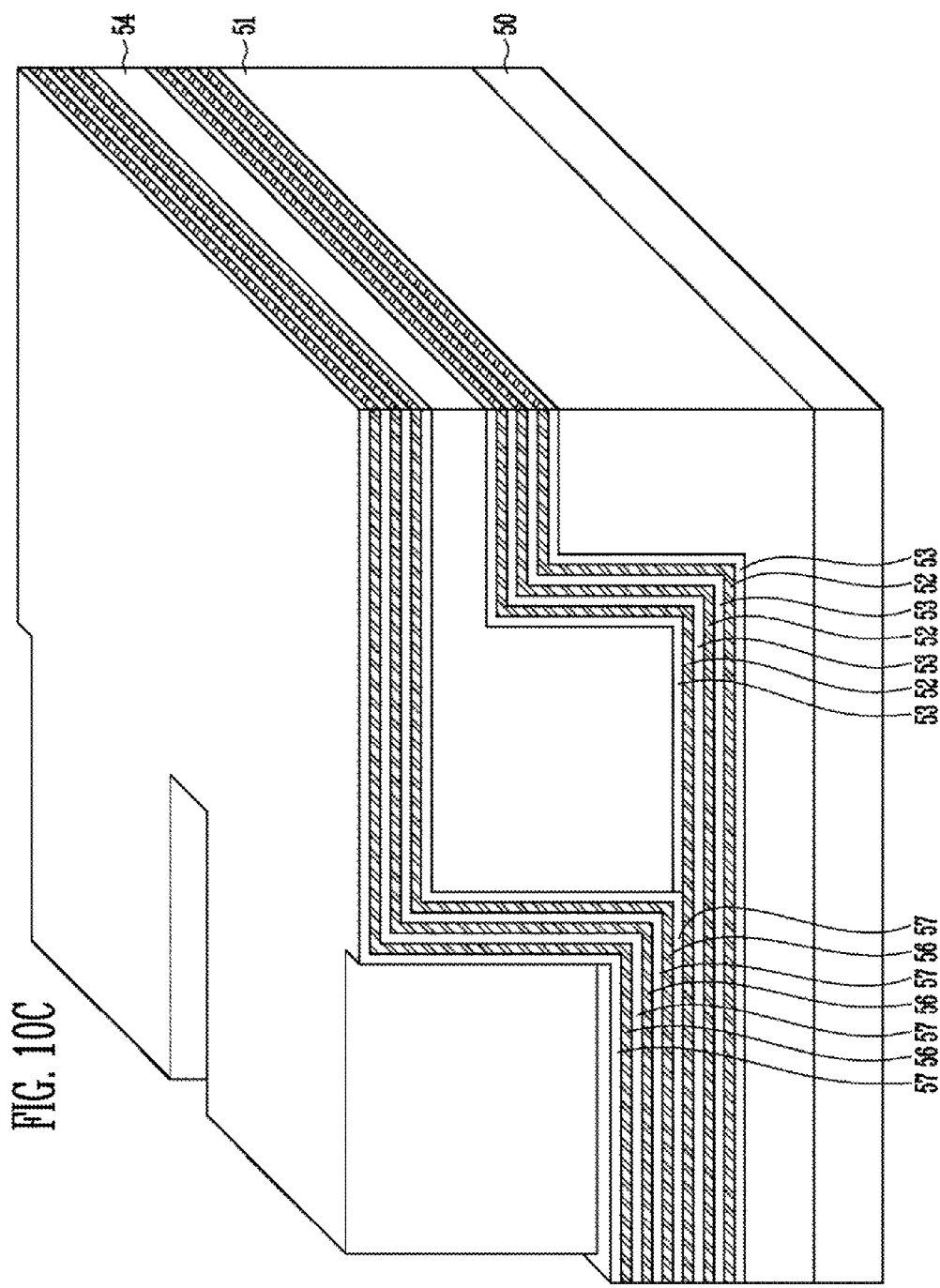

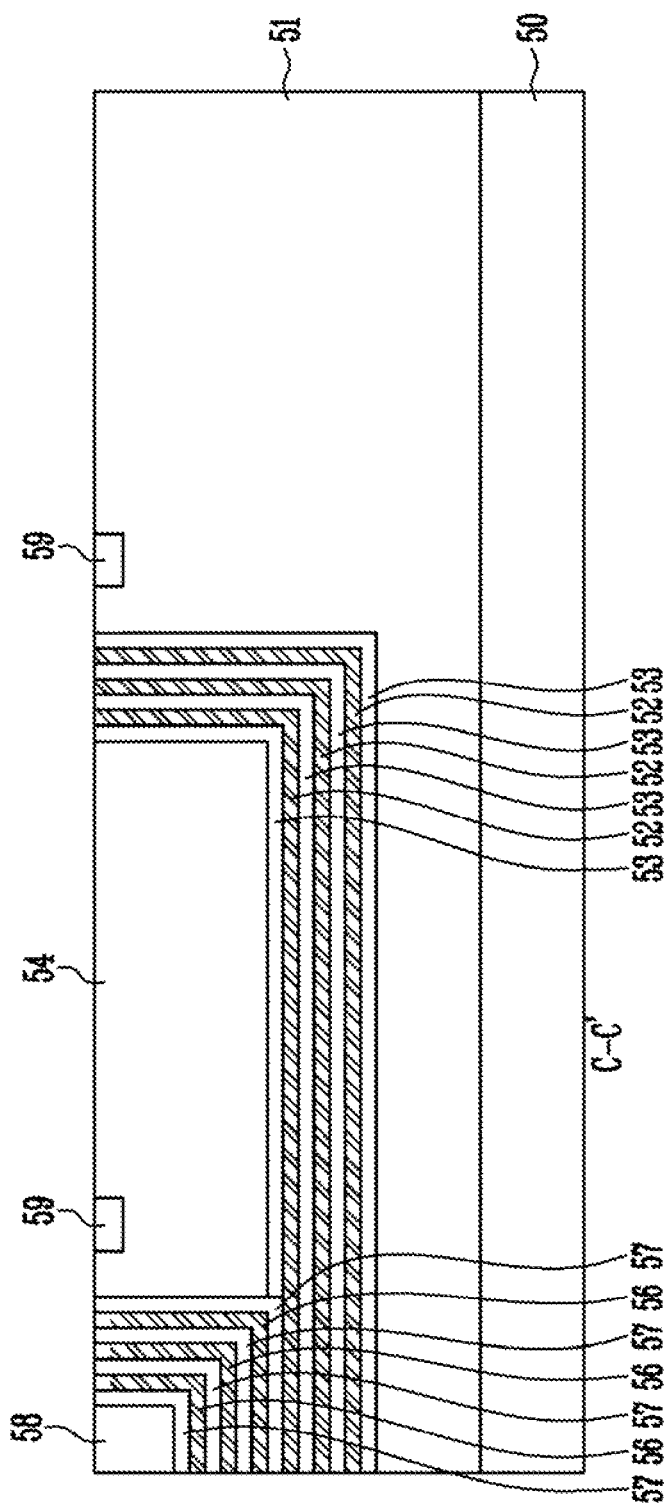

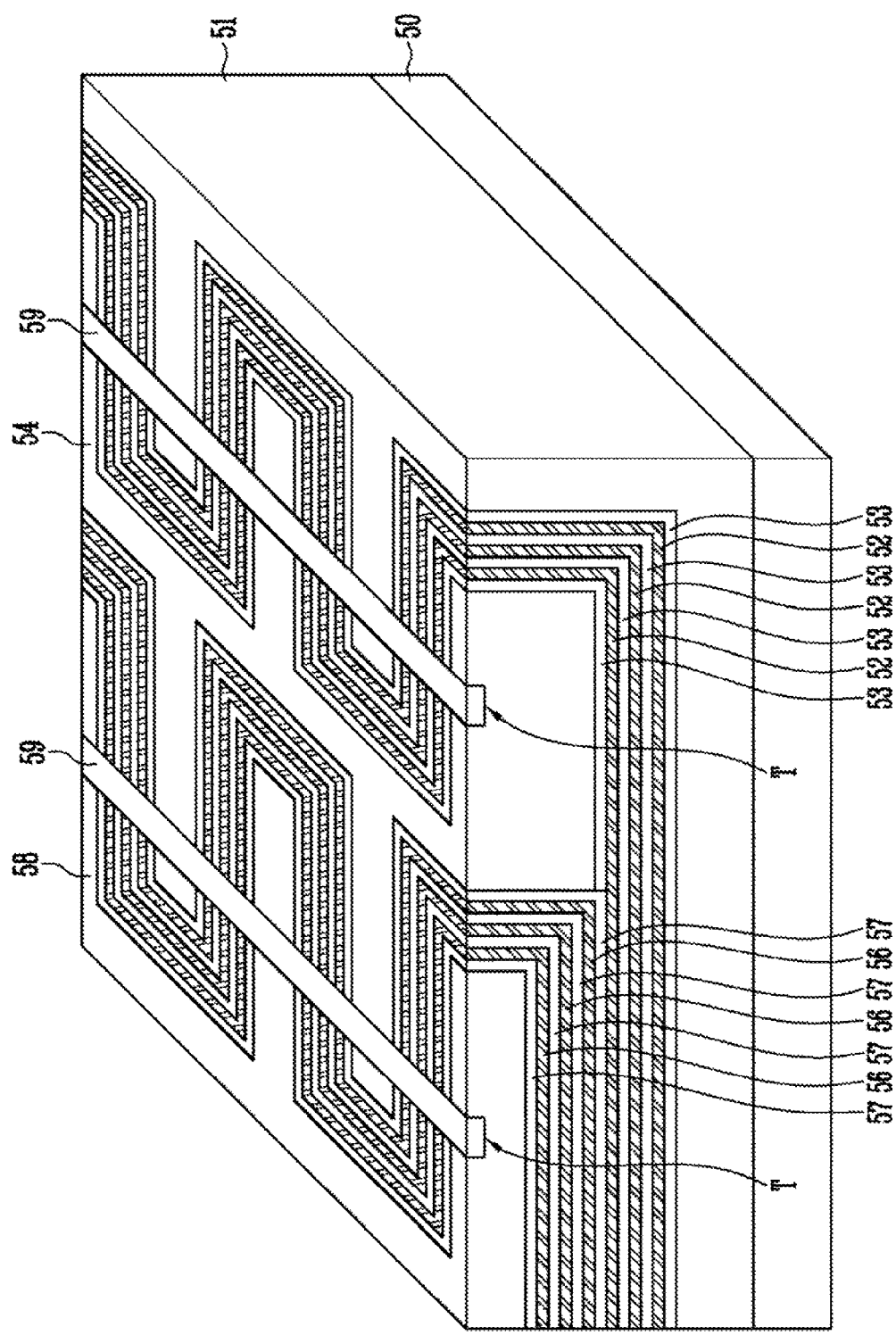

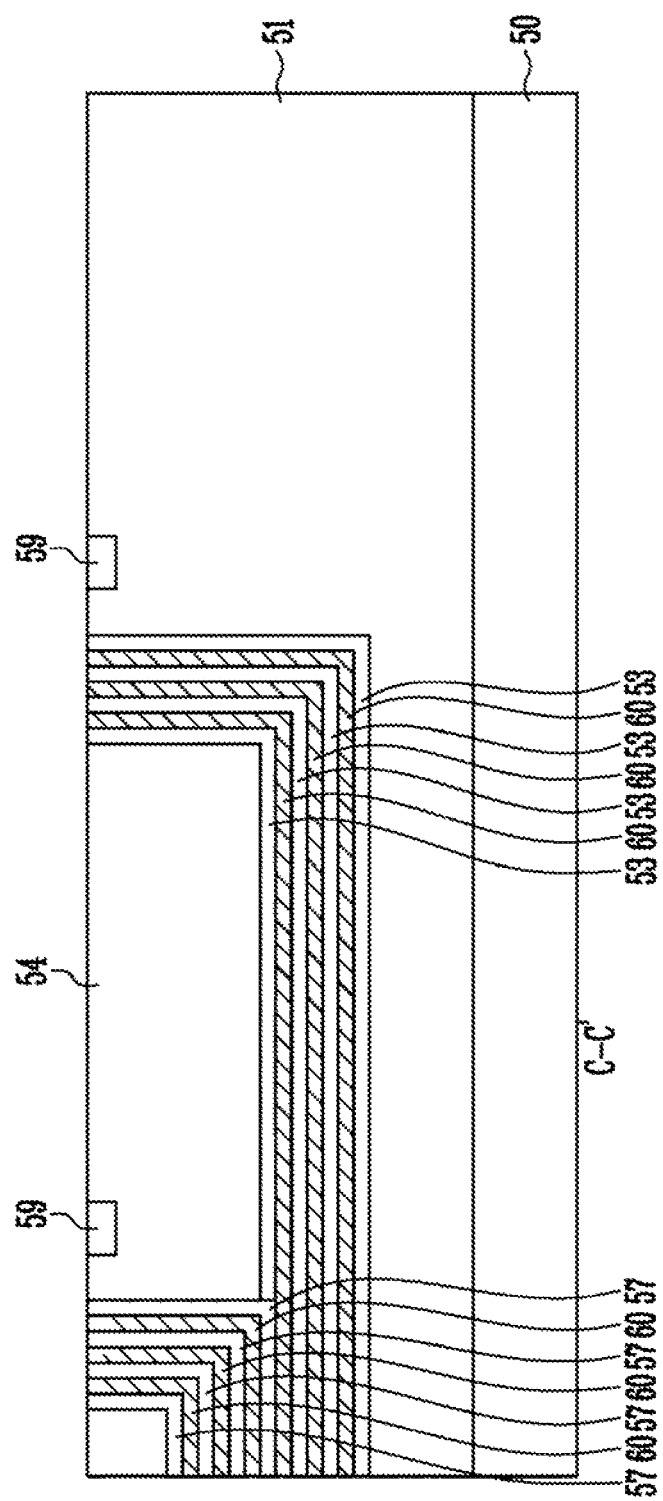

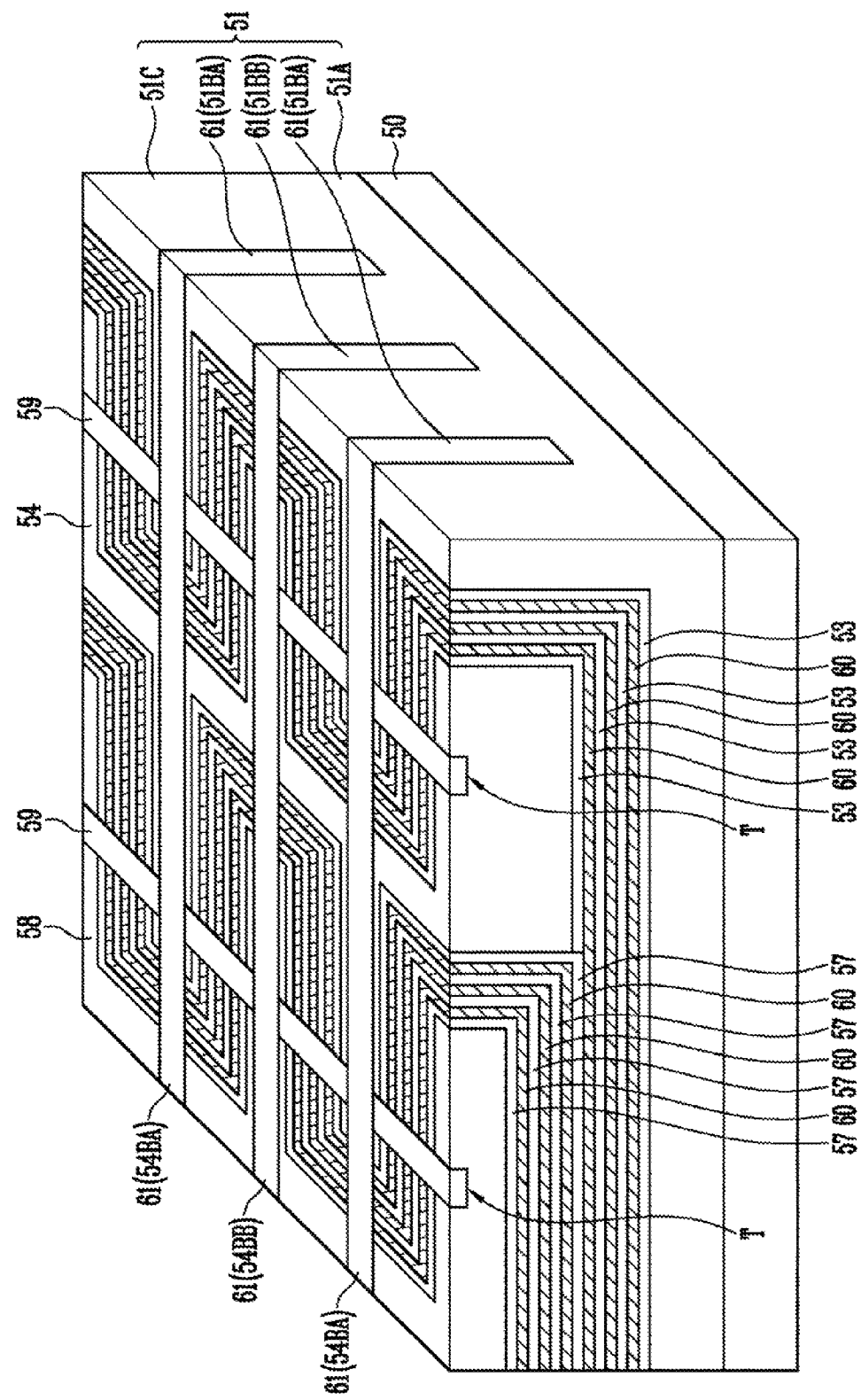

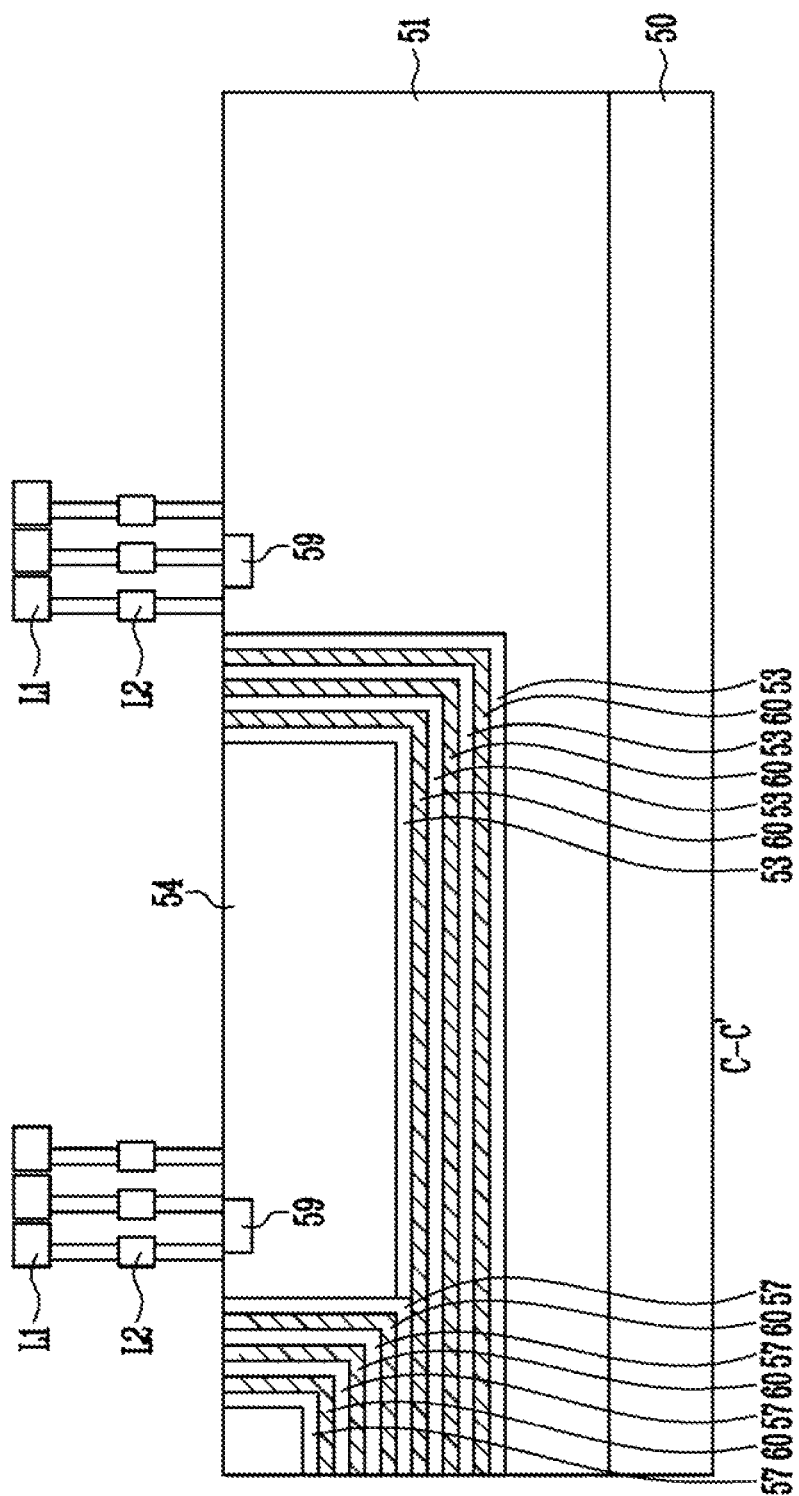

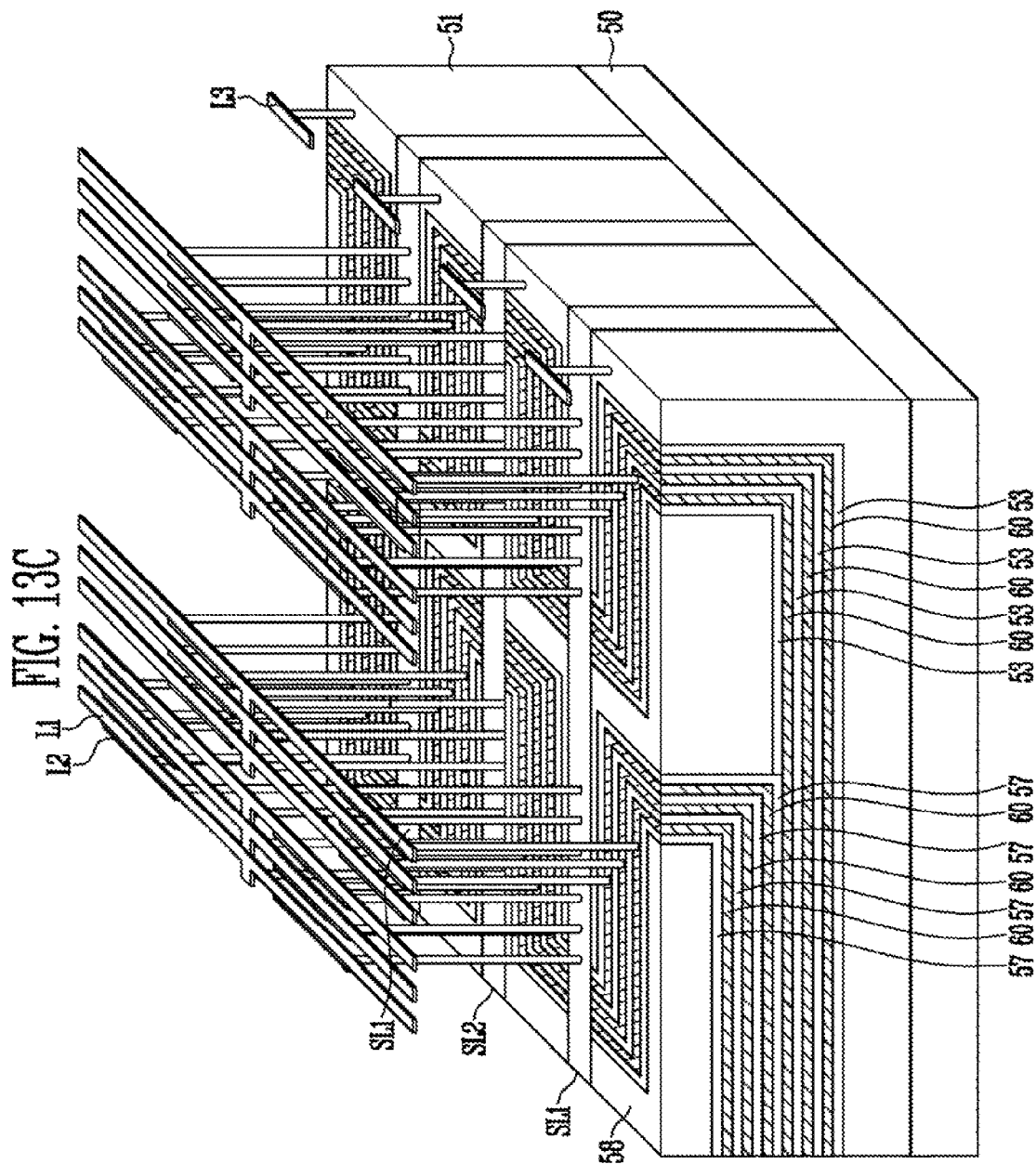

SEMICONDUCTOR DEVICE AND METHOD OF MANUFACTURING THE SAME

CROSS-REFERENCE TO RELATED APPLICATIONS

The present application claims priority on Korean patent application number 10-2013-0095504, filed on Aug. 12, 2013, the entire disclosure, of which is hereby incorporated herein in its entirety by reference.

BACKGROUND

1. Field of Invention

Various exemplary embodiments of the present invention relate to an electronic device and, more particularly, to a three-dimensionally stacked memory device having memory cells and a method of manufacturing the same.

2. Description of Related Art

A non-volatile memory retains data stored therein even when not powered. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

In a three-dimensional non-volatile memory device, a plurality of word lines may be stacked. Therefore, in order to select a desired word line, among the stacked word lines staked, pad portions are defined in the respective word lines, and contact plugs are coupled to the respective pad portions. Conventionally, pad portions may be defined by patterning the stacked word lines into a stepped structure. However, it is difficult to pattern the word lines into the stepped structure, because of the contact region having a wide area. Therefore, an increase in the degree of integration of a memory device may be difficult.

SUMMARY

Various exemplary embodiments of the present invention relate to a semiconductor device allowing for easy manufacture and having an increased degree of integration, and a method of manufacturing the same.

A semiconductor device according to an exemplary embodiment of the present invention may include a plurality of transistors formed over a substrate, a support body including a horizontal portion and protrusions, wherein the horizontal portion covers at least one of the transistors, and the protrusions are formed over the horizontal portion and located between the transistors, and conductive layers and insulating layers alternately stacked over the support body and protruding upwardly along the sidewalls of the protrusions.

A semiconductor device according to an exemplary embodiment of the present invention may include a plurality of first transistors formed in a first contact region of a substrate, a plurality of second transistors formed in a second contact region of the substrate, a first support body including a first horizontal portion and a plurality of first protrusions, wherein the first horizontal portion covers at least one each of the first and second transistors, and the first protrusions are coupled to the first horizontal portion and located between the plurality of first transistors, a plurality of first conductive layers and a plurality of first insulating layers alternately stacked over the first support body and protruding upwardly along the sidewalls of the first protrusions, a second support body including a second horizontal portion and a plurality of second protrusions, wherein the second horizontal portion covers the first conductive layers and the first insulating layers, formed in the first contact region, and the second protrusions are coupled to the second horizontal portion and located between the second transistors, and a plurality of second conductive layers and a plurality of second insulating layers alternately stacked over the first conductive layers and the first insulating layers, formed in the second contact region, wherein the second conductive layers protrude upwardly along the side walls of the second protrusions.

A method of manufacturing a semiconductor device according to an exemplary embodiment of the present invention may include forming a plurality of first transistors located in a first contact region of a substrate, forming a first support body including a first horizontal portion and first protrusions, wherein the first horizontal portion covers at least one of the first transistors, and the first protrusions are coupled to the first horizontal portion and located between the first transistors, and alternatively stacking a plurality of first conductive layers and a plurality of first insulating layers over the first support body and protruding upwardly along the sidewalls of the first protrusions.

BRIEF DESCRIPTION OF THE DRAWINGS

FIGS. 3A to 8A, 3B to 8B and 3C to 8C are views illustrating a method of manufacturing a semiconductor device according to an exemplary embodiment of the present invention;

FIGS. 9A to 13A, 9B to 13B and 9C to 13C are views illustrating a method of manufacturing a semiconductor device according to an exemplary embodiment of the present invention;

DETAILED DESCRIPTION

Figure 1A:
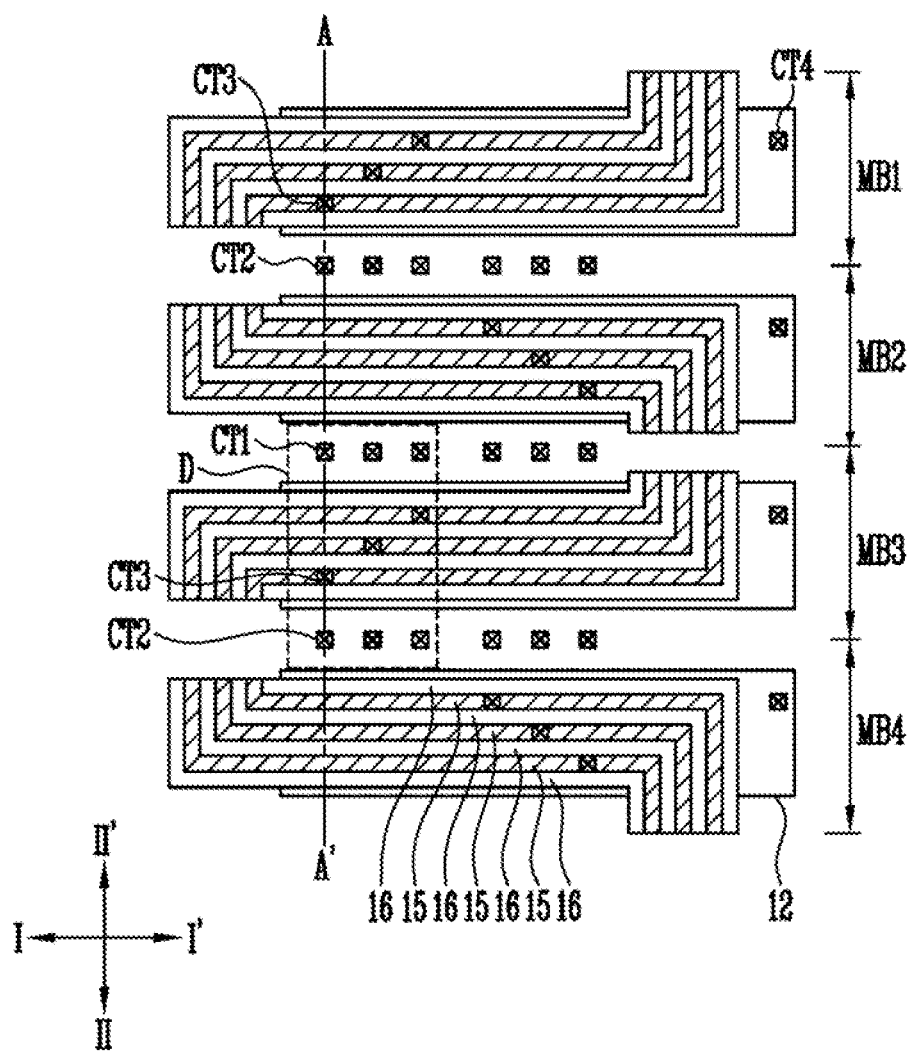
FIGS. 1A to 1C are views illustrating the configuration of a semiconductor device according to an exemplary embodiment of the present invention.

Hereinafter, various embodiments of the present invention will be described with reference to the accompanying drawings. In the drawings, the thicknesses and distances between the components are exaggerated compared to an actual physical thickness and interval for the convenience of illustration. In the following description, detailed explanation of known related functions and constitutions may be omitted to avoid unnecessarily obscuring the subject manner of the present invention. Like reference numerals refer to like elements throughout the specification and drawings.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1B:
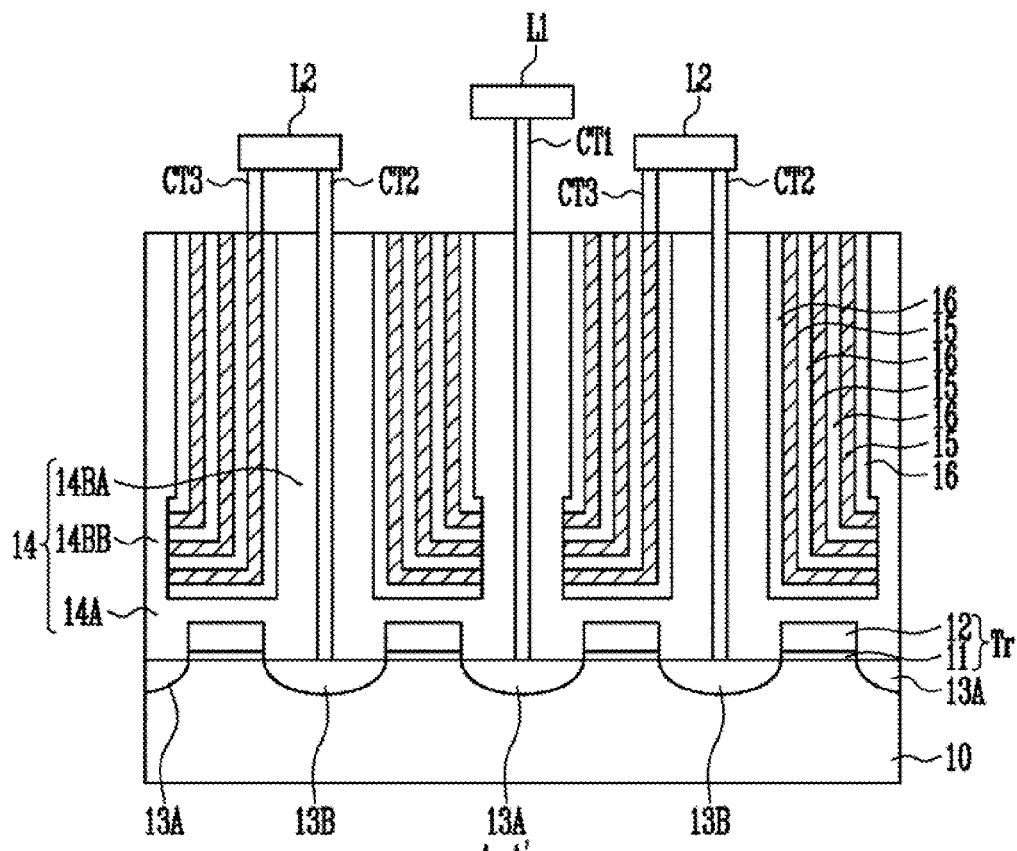
Figure 1C:
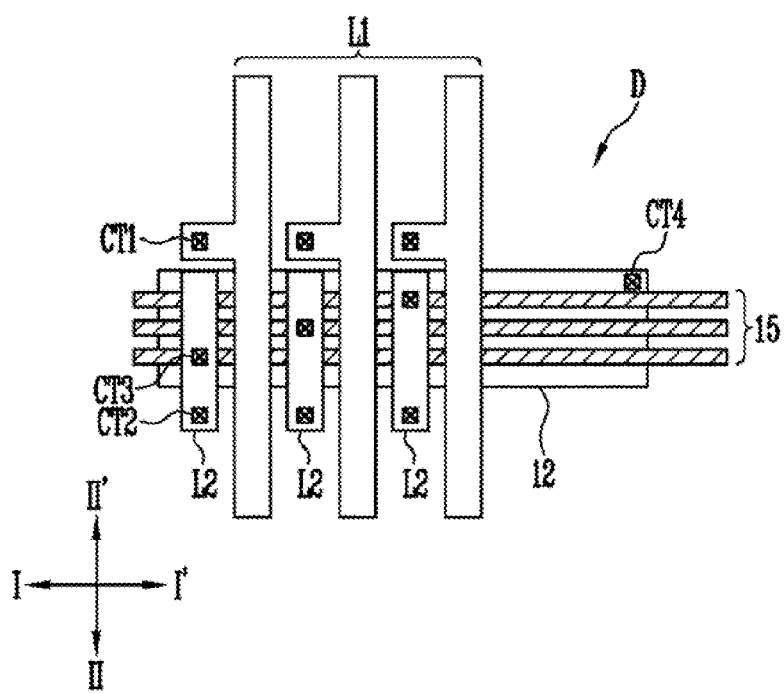

FIGS. 1A to 1C are views illustrating the configuration of a semiconductor device according to an exemplary embodiment of the present invention. FIG. 1A is a layout view of a contact region. FIG. 1B is a cross-sectional view taken along line A-A' of FIG. 1A. FIG. 1C is a layout view of lines coupled in an area D.

As illustrated in FIGS. 1A to 1C, a semiconductor device according to an exemplary embodiment of the present invention may include a plurality of transistors Tr, a support body 14, a plurality of conductive layers 15, a plurality of insulating layers 16, a plurality of contact plugs CT1 to CT4 and a plurality of lines L1 and L2 that are formed over a substrate 10.

Each transistor Tr may include a gate insulating layer formed over the substrate 10, and a gate electrode 12 formed over the gate insulating layer 11. In addition, first and second junctions 13A and 13B may be formed in the substrate 10, on both sides of each of the gate electrodes 12. The transistors Tr may be arranged in each of the memory blocks MB1 to MB4. The gate electrodes 12 of the transistors Tr, located in each one of the memory blocks MB1 to MB4, may be coupled to each other by a single gate pattern.

The support body 14 may include a horizontal portion 14A and protrusions 14BA and 14BB coupled to the horizontal portion 14A. For example, the support body 14 may include an insulating material, such as an oxide layer.

The horizontal portion 14A may have a thickness large enough to cover the transistor Tr. In addition, the horizontal portion 14A may be formed to cover a cell region and the contact region of the substrate 10.

The protrusions 14BA and 14BB may be formed over the horizontal portion 14A. For example, the protrusions 14BA and 14BB may be formed in bar shapes that protrude from a top surface of the horizontal portion 14A and extend in a first direction I-I'. In addition, the protrusions 14BA and 14BB may be located between the transistors Tr, for example, at the boundaries between neighboring memory blocks MB1 to MB4.

The protrusions 14BA and the horizontal portion 14A may be formed at the same time so that the protrusions 14BA may be connected to the horizontal portion 14A in a single body. On the other hand, the protrusions 14BB may be formed by a separate process from that forming the horizontal portion 14A. In this example, the protrusions 14BA may function as deposition surfaces for the conductive layers 15 and the insulating layers 16. In addition, the protrusions 14BB may function to separate the conductive layers 15, stacked along the sidewalls of the protrusions 14BA, from each other.

For example, the protrusions 14BA may be located at the boundary between an n-th memory block and an n+1-th memory block, where 'n' may be an odd or even number. When 'n' is an odd number, the protrusions 14BA may be located at the boundary between a first memory block MB1 and a second memory block MB2, and the boundary between a third memory block MB3 and a fourth memory block MB4. In addition, the protrusions 14BB may be located at the boundary between the second memory block MB2 and the third memory block MB3.

The plurality of conductive layers 15 and the plurality of insulating layers 16 may be alternately stacked over the support body 14. The conductive layers 15, stacked over the horizontal portion 14A, may be stacked in a horizontal direction. On the other hand, the conductive layers 15, stacked along the sidewalls of the protrusions 14BA, may protrude upwardly. For example, the conductive layers 15 may be word lines or selection lines. In addition, the conductive layers 15 may include polysilicon or tungsten.

First and second lines L1 and L2 may be formed over the conductive layers 15 and the insulating layers 16. The conductive layers 15 may extend in a first direction I-I', the first lines L1 may extend in a second direction crossing the first direction I-I', and the second lines L2 may extend in the second direction II-II'.

The first lines L1 may be coupled to the first junction 13A of the transistors Tr. For example, the first contact plugs CT1 may pass through the protrusions 14BB and couple the first junctions 13A and the first lines L1 to each other. In addition, the second lines L2 may couple the second junctions 13B of the transistors Tr to the conductive layers 15. For example, the second contact plugs CT2 may pass through the protrusions 14BA and couple the second junctions 13B and the second lines L2 to each other, and the third contact plugs CT3 may couple the conductive layers 15 and the second lines L2 to each other.

For example, when the conductive layers 15 are word lines, the first lines L1 may be global word lines, the second lines L2 may be local word lines, and the transistors Tr may be switch devices that couple the global word lines to the local word lines. In this example, a block selection signal may be applied to gate electrodes of the transistors through the fourth contact plug CT4 coupled to respective gate patterns.

As described above, since the transistors Tr are located under the pad portions of the conductive layers 15, the area of the contact region may be reduced. Therefore, a degree of integration for the semiconductor device may be increased.

Figure 2A:
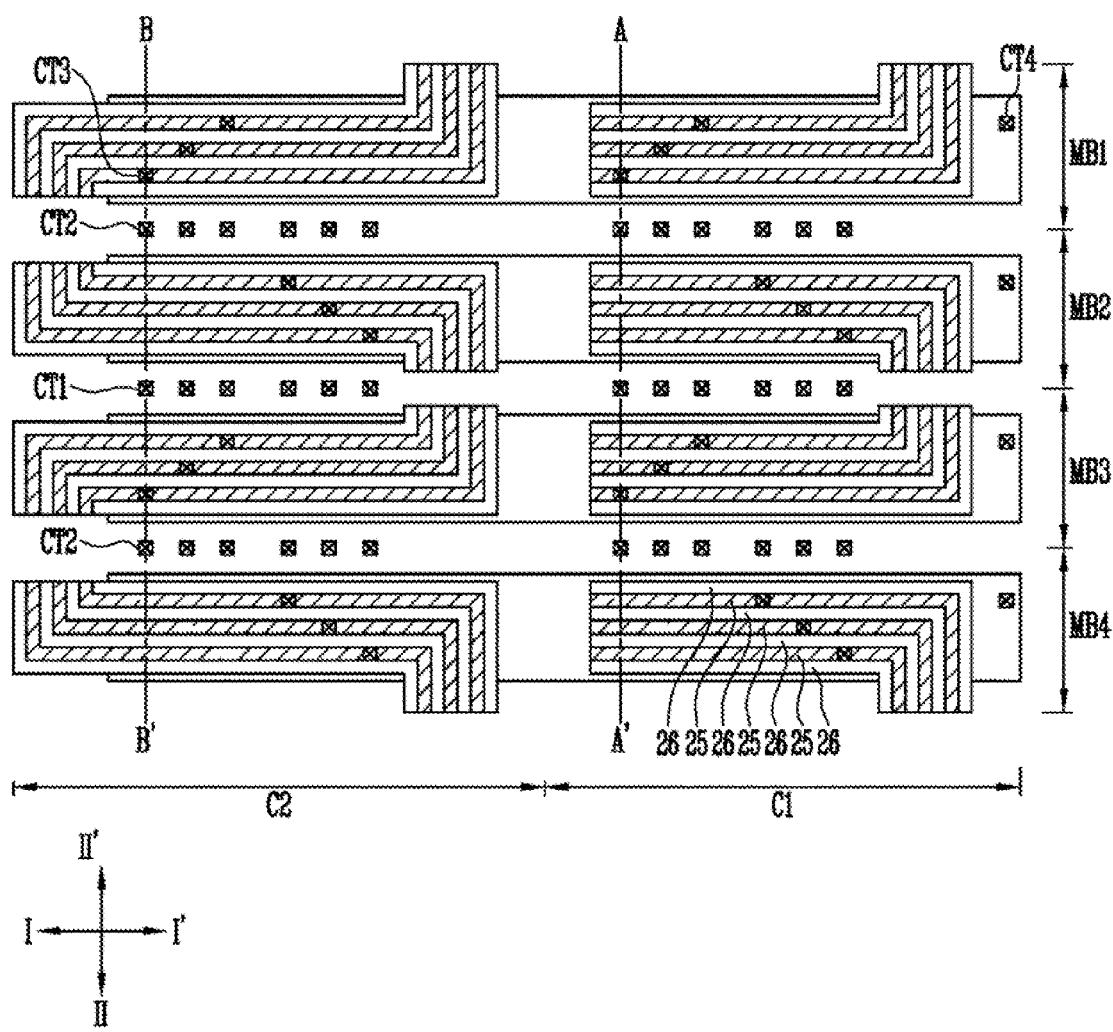
FIGS. 2A to 2C are views illustrating the configuration of a semiconductor device according to an exemplary embodiment of the present invention.
Figure 2B:
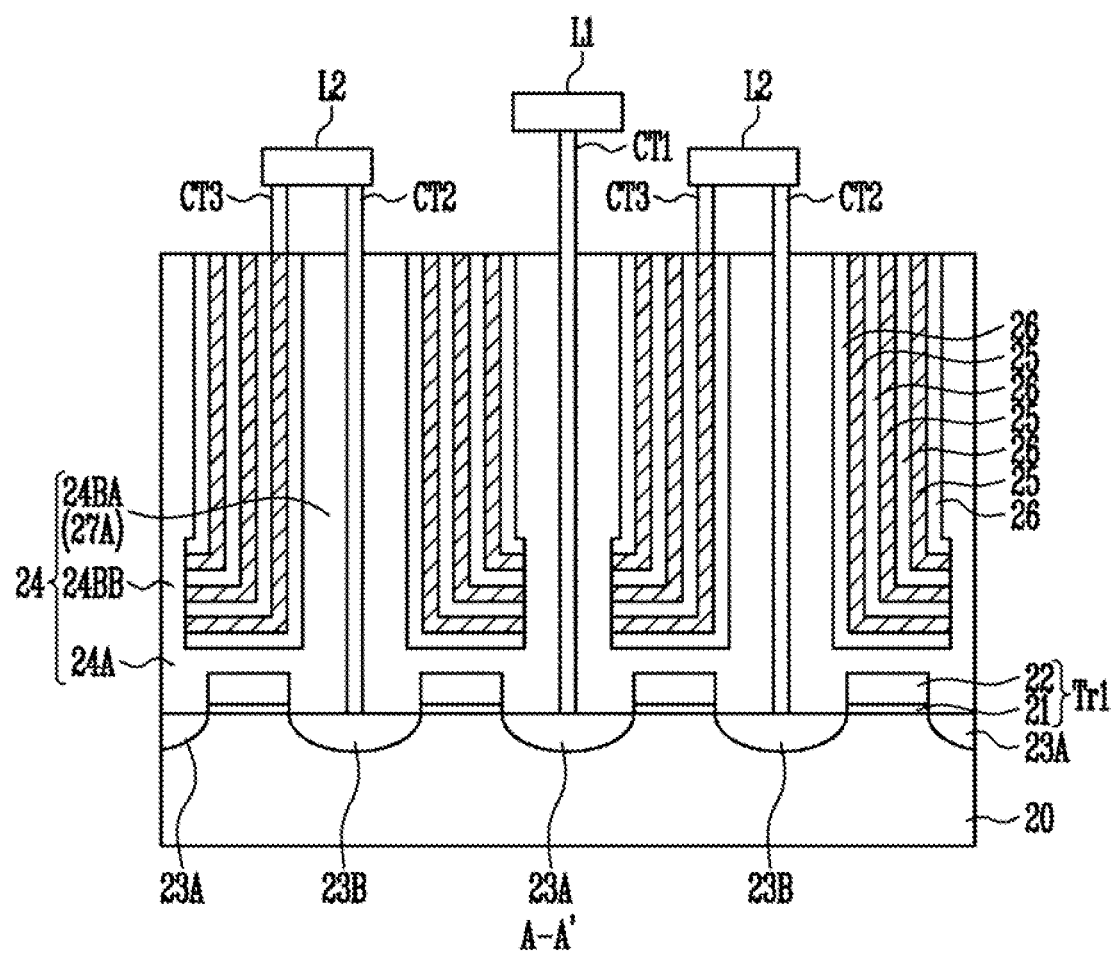
Figure 2C:
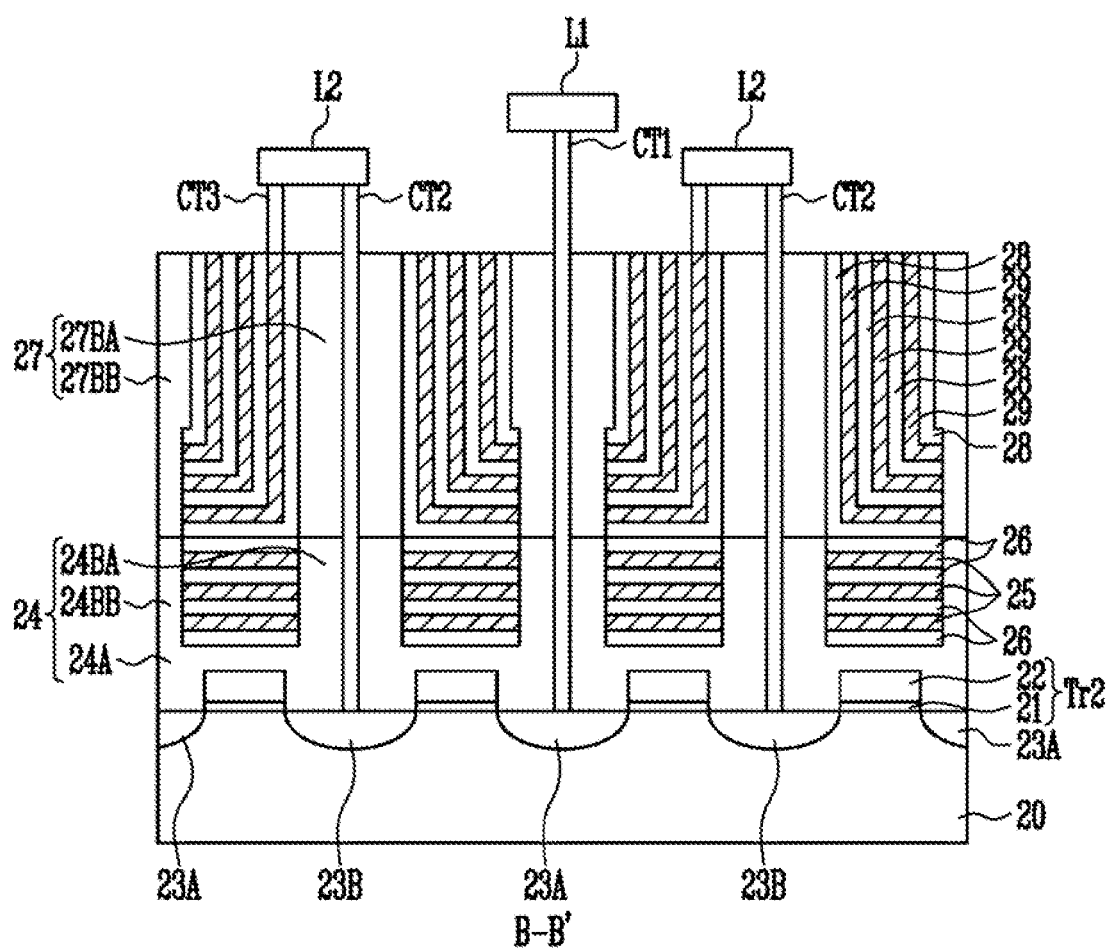

FIGS. 2A to 2C are views of the configuration of a semiconductor device according to another exemplary embodiment of the present invention. FIG. 2A is a layout view of a contact region, FIG. 2B is a cross-sectional view taken along line A-A' of FIG. 2A, and FIG. 2C is a cross-sectional view taken along line B-B' of FIG. 2A.

As illustrated in FIGS. 2A to 2C, a semiconductor device according to another exemplary embodiment of the present invention may include transistors Tr1 and Tr2, support bodies 24 and 27, conductive layers 25 and 29, insulating layers 26 and 28, contact plugs CT1 to CT4, and lines L1 and L2 that are formed over a substrate 20.

A plurality of contact regions may be defined in the substrate 20. Pad portions may be dispersed in the plurality of contact regions. For example, when the first and second contact regions C1 and C2 are defined in the substrate 10, pad portions of the first conductive layers 25, stacked at a lower part of the semiconductor device, may be defined in the first contact region C1, and pad portions of the second conductive layers 29, stacked at an upper part of the semiconductor device, may be defined in the second contact region C2.

The first transistors Tr1 may be arranged in the first contact region C1 of the substrate 20. The second transistors Tr2 may be arranged in the second contact region C2 of the substrate 20. Gate electrodes 22 of the first and second transistors Tr1 and Tr2, located in each one of the memory blocks MB1 to MB4, may be coupled by a single gate pattern. In addition, each of the fourth contact plugs CT4 may be coupled to each of the gate patterns.

The first support body 24 may include a first horizontal portion 24A and first protrusions 24BA and 24BB protruding from a top surface of the first horizontal portion 24A. The first horizontal portion 24A may be formed to cover the first and second transistors Tr1 and Tr2. The first protrusions 24BA and 24BB may be located between the first transistors Tr1. The first protrusions 24BA and the first horizontal portion 24A may be formed at the same time so that the first protrusions 24BA may be connected to the first horizontal portion 24A in a single body. The first protrusions 24BB may be formed by a separate process from that forming the first horizontal portion 24A. In addition, the first protrusions 24BB may include a horizontal portion 27A of the second support body 27.

The first conductive layers 25 and the first insulating layers 26 may be alternately stacked over the first support body 24, and may protrude upwardly and be stacked along the sidewalls of the first protrusions 24BA.

The second support body 27 may include the second horizontal portion 27A and second protrusions 27BA and 27BB protruding from a sidewall of the second horizontal portion 27A. The second horizontal portion 27A may cover the first conductive layers 25 and the first insulating layers 26 formed in the first contact region C1, and the second protrusions 27BA and 27BB may be located between the second transistors Tr2. The protrusions 27BA and the horizontal portion 27A may be formed at the same time so that the protrusions 27BA may be connected to the horizontal portion 27A in a single body. The protrusions 27BB may be formed by a separate process from that forming the horizontal portion 27A. In this example, the protrusions 27BA may function as deposition surfaces for the second conductive layers 29 and the second insulating layers 28. In addition, the protrusions 27BB may function to separate the second conductive layers 29 and the second insulating layers 28, stacked along the sidewalls of be protrusions 27BA, from each other.

The second conductive layers 29 and the second insulating layers 28 may be alternately stacked over the first conductive layers 25 and the first insulating layers 26 in the second contact region C2, and may protrude upwardly and be stacked along the sidewalls of the second protrusions 27BA.

The first and second lines L1 and L2 may be formed over the first and second conductive layers 25 and 29 and the first and second insulating layers 26 and 28. The first and second conductive layers 25 and 29 may extend in a first direction I-I', the first lines L1 may extend in a second direction and the second lines L2 may extend in the second direction II-II".

The first lines L1 may be coupled to the first junctions 23A of the first and second transistors Tr1 and Tr2. For example, the first contact plugs CT1, located in the first contact region C1, may pass through the first support body 24 and couple the first junctions 23A of the first transistors Tr1, respectively, to the first lines L1. In addition, the first contact plugs CT1 located in the second contact region C2, may pass through the first support body 24 and the second protrusions 27BB and couple the first junctions 23A of the second transistors Tr2, respectively, to the first lines L1.

In addition, the second lines L2 may couple the first conductive layers 25 to second junctions 23B of the first transistors Tr1, respectively, or couple the second conductive layers 29 to the second junctions 23B of the second transistors Tr2, respectively. For example, the second contact plugs CT2, located in the first contact region C1, may pass through the first support body 24 and couple the second junctions 23B of the first transistors Tr1 respectively, to the second lines L. The third contact plugs CT3 may couple the first conductive layers 25 and the second lines L2 to each other. In addition, the second contact plugs CT2, located in the second contact region C2, may pass through the first support body 24 and the second protrusions 27BA and couple the second junctions 23B of the second transistors Tr2, respectively, to the second lines L2. The third contact plugs CT3 may couple the second conductive layers 29 and the second lines L2 to each other.

As described above, since pad portions are dispersed in the first and second contact regions C1 and C2, the number of first and second conductive layers 25 and 29 to be stacked may be increased. Therefore, a degree of integration for the semiconductor device may be increased.

FIGS. 3A to 8A, 3B to 8B and 3C to 8C are views illustrating a method of manufacturing a semiconductor device according to an exemplary embodiment of the present invention. In each of the drawings, a contact region is mainly illustrated. FIGS. 3A to 8A are plan views, FIGS. 3B to 8B are cross-sectional views taken along line A-A' of FIGS. 3A to 8A, respectively, and FIGS. 3C to 8C are perspective views.

Figure 3A:
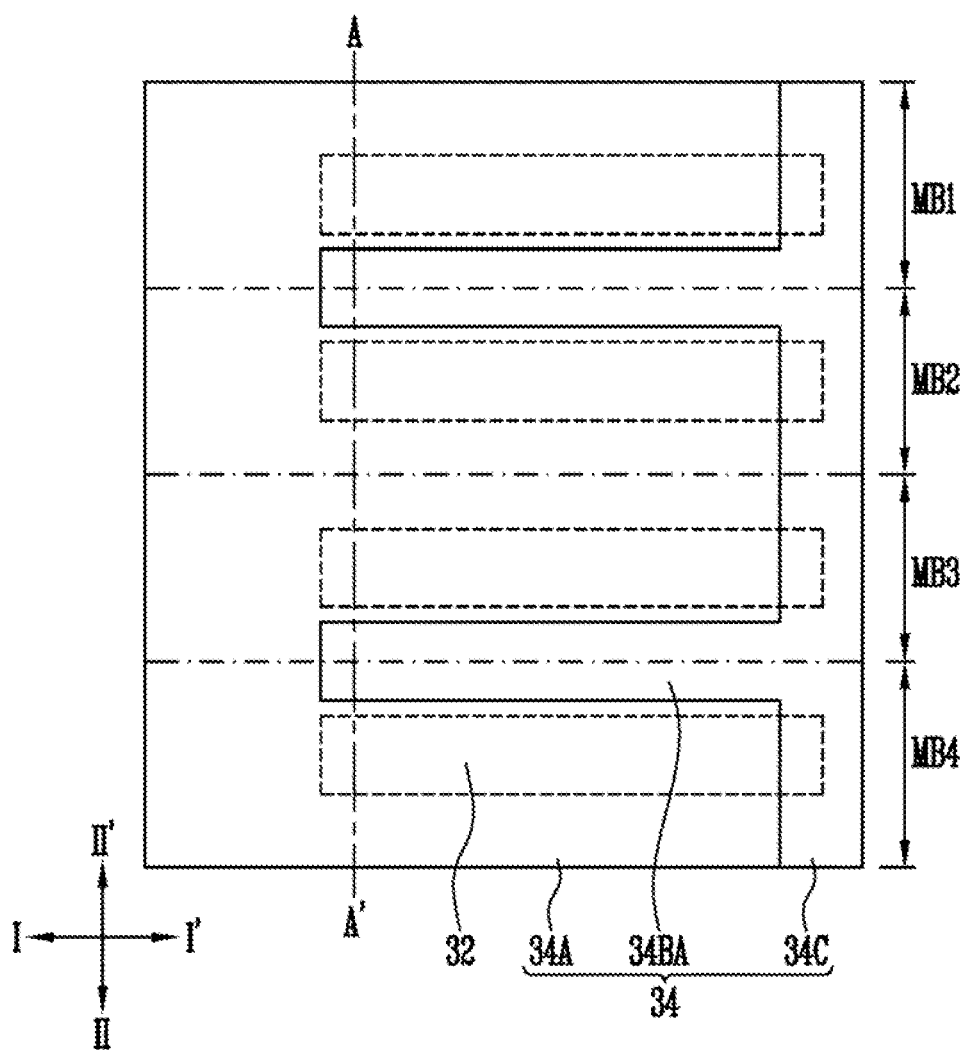
Figure 3B:
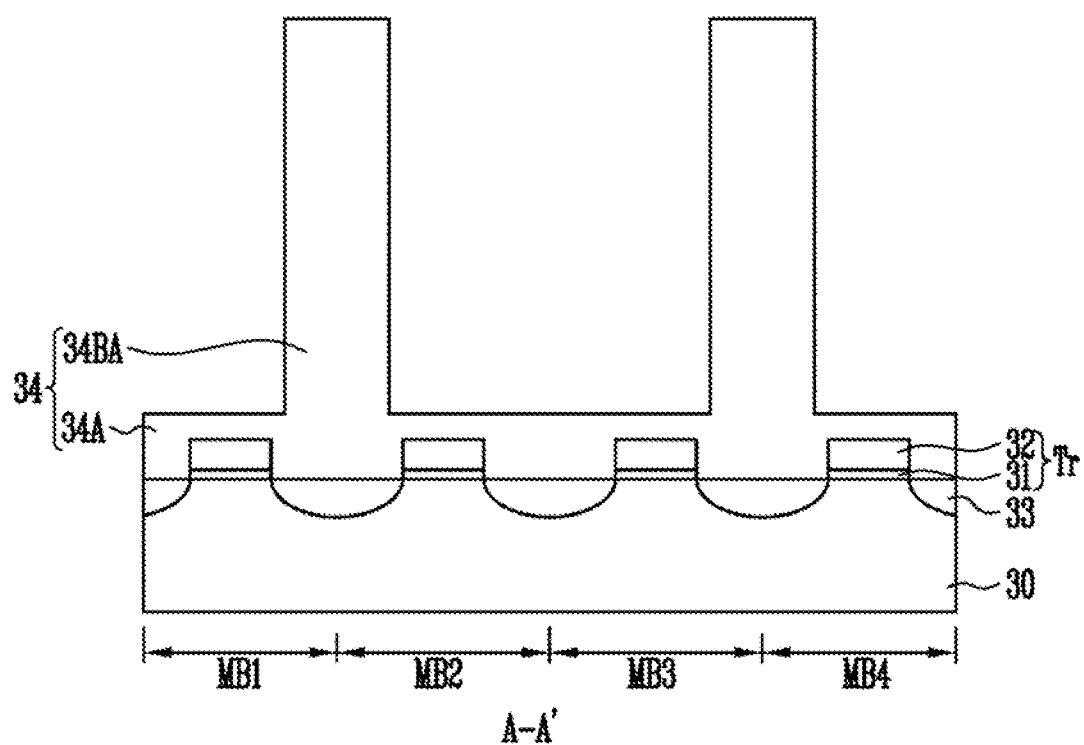

As illustrated in FIGS. 3A to 3C, a plurality of transistors Tr, each of which includes a gate insulating layer 31 and a gate electrode 32, may be formed on a substrate 30 in which a cell region and a contact region are defined. The transistors Tr may be located in the contact region of the substrate 30. Subsequently, the substrate 30 may be doped with impurities on both sides of the gate electrode 32 to form junctions 33.

A support body 34 may include a horizontal portion 34A that covers the transistors Tr, and a plurality of protrusions 34BA that, are located between the transistors Tr. The support body 34 may further include a coupling portion 34C that couples one set of ends of the protrusions 34BA. In addition, the coupling portions 34C may be formed on the circumferences of the memory blocks MB1 to MB4.

The protrusions 34BA may be formed at all or part of the boundaries between the neighboring memory blocks MB1 to MB4. Distances between the protrusions 34BA may be determined by the number of first and second material layers to be stacked. For example, the distance between the protrusions 34BA may be determined to form enough space (where a protrusion 34BB is formed; please refer to FIG. 7B) between a vertical portion of first and second material layers stacked along a sidewall of one of the protrusions 34BA, and a vertical portion of first and second material layers stacked along a sidewall of a neighboring protrusion.

Figure 4A:
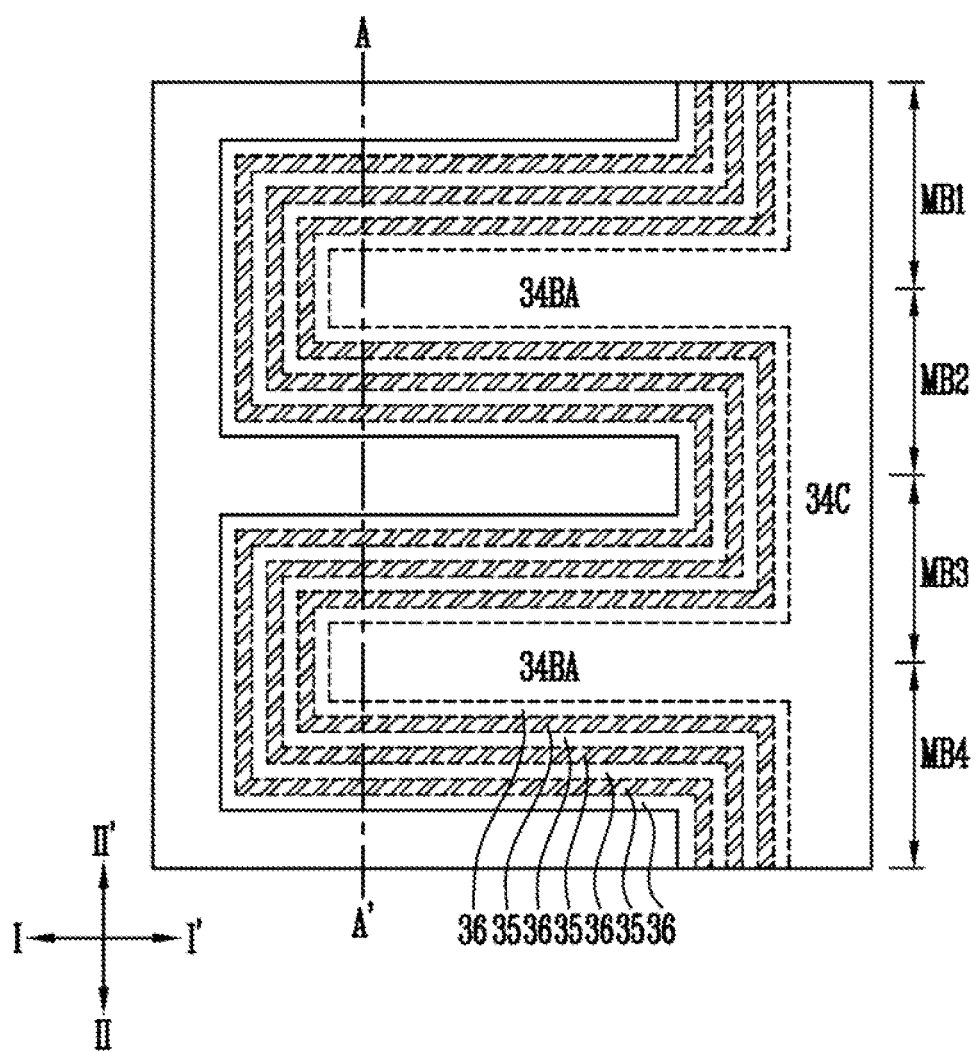
Figure 4B:
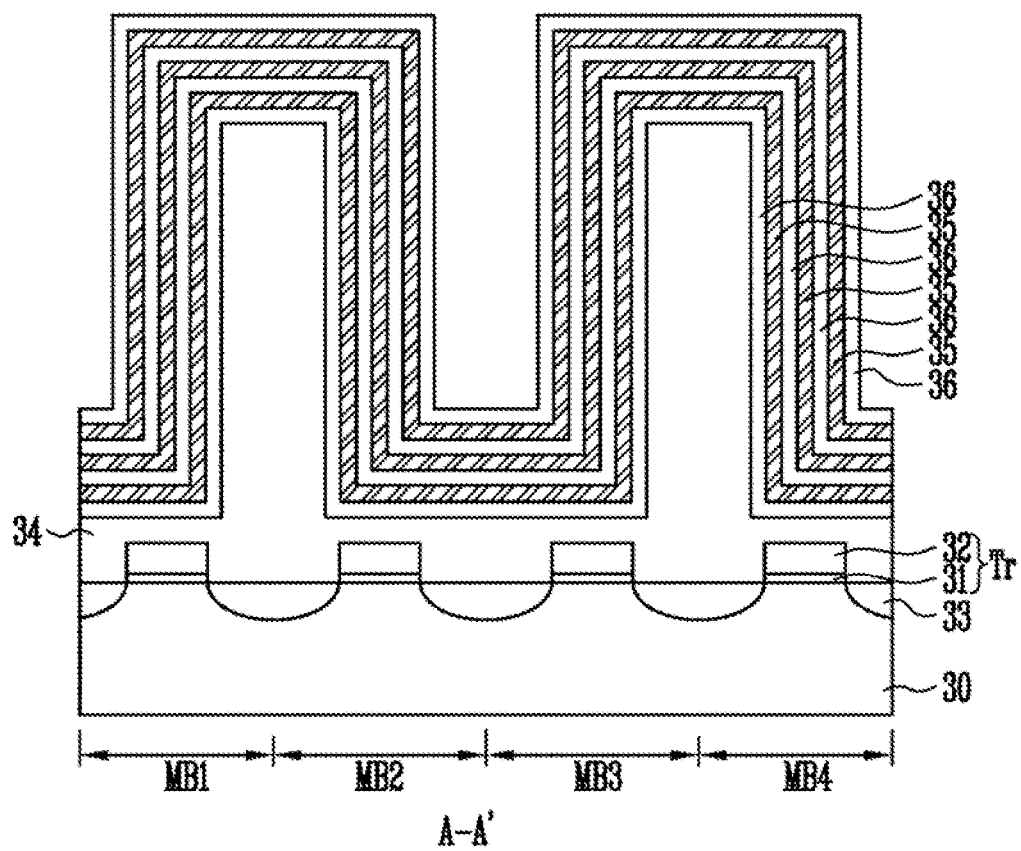
Figure 4C:
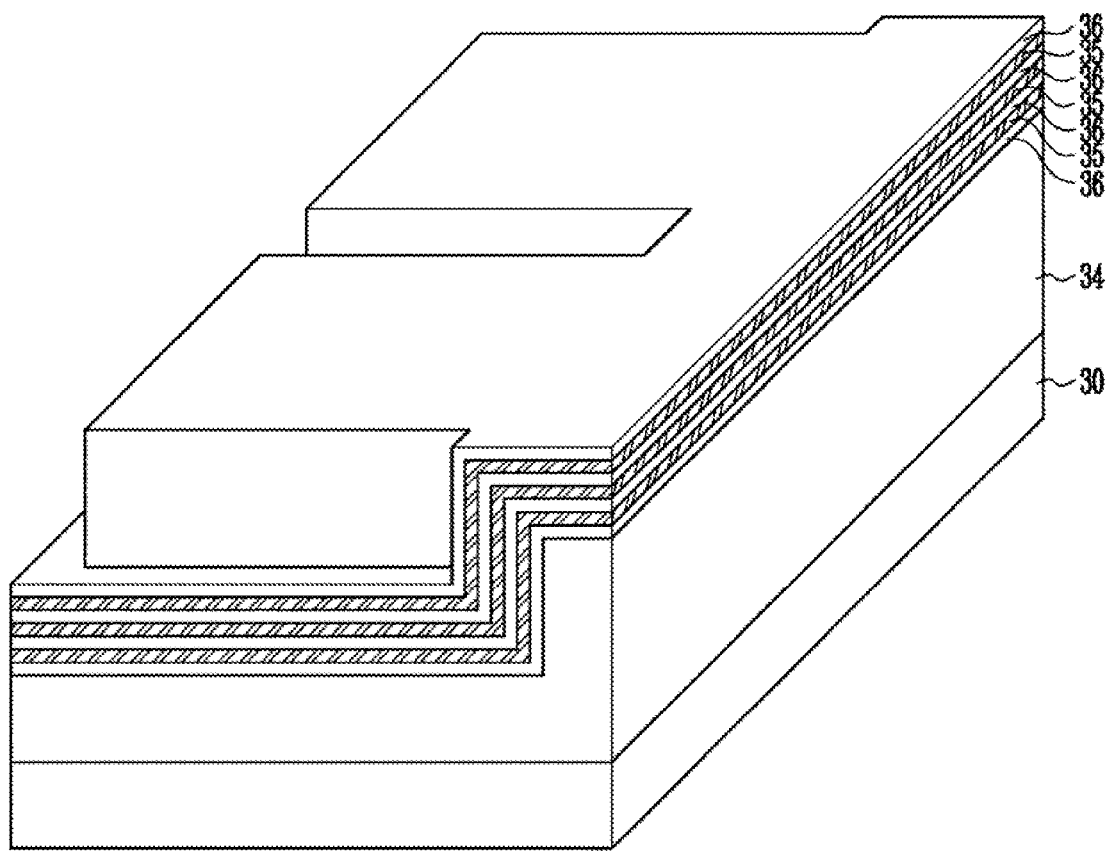

As illustrated in FIGS. 4A to 4C, first material layers 35 and second material layers 36 may be alternately formed over the support body 34. The first material layers 35 may be provided to form conductive layers, such as word lines and selection lines. The second material layers 36 may be provided to form insulating layers that electrically separate the stacked conductive layers.

The first material layers 35 may include a material having a higher etch selectivity compared to the second material layers 36. For example, the first material layers 35 may include sacrificial layers including a nitride, and the second material layers 36 may include insulating layers including an oxide. Alternatively, the first material layers 35 may include conductive layers including polysilicon, and the second material layers 36 may include insulating layers including an oxide. Alternatively, the first material layers 35 may include conductive layers including doped polysilicon, doped amorphous silicon or the like, and the second material layers 36 may include sacrificial layers including undoped polysilicon, undoped amorphous silicon or the like. In this embodiment, the description is made in reference to an example in which the first material layers 35 include sacrificial layers, and the second material layers 36 include insulating layers.

Figure 5A:
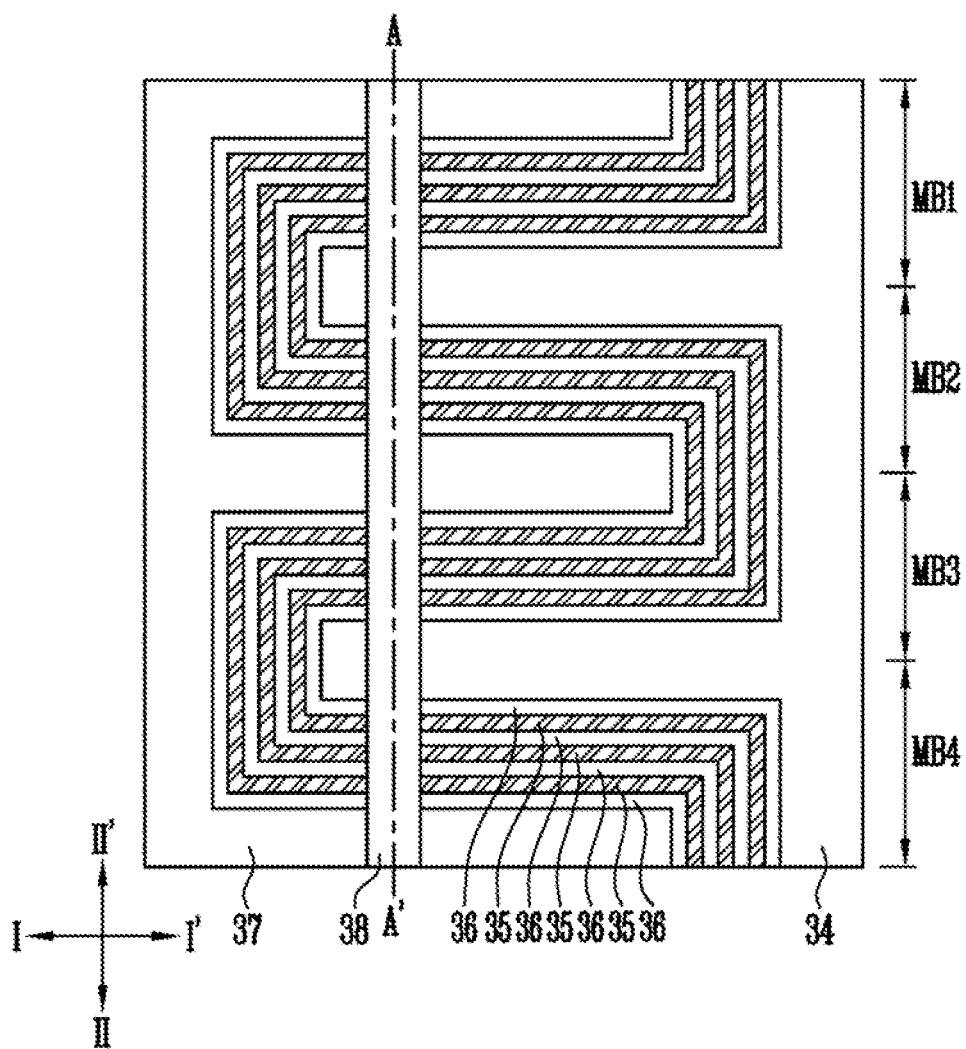
Figure 5B:
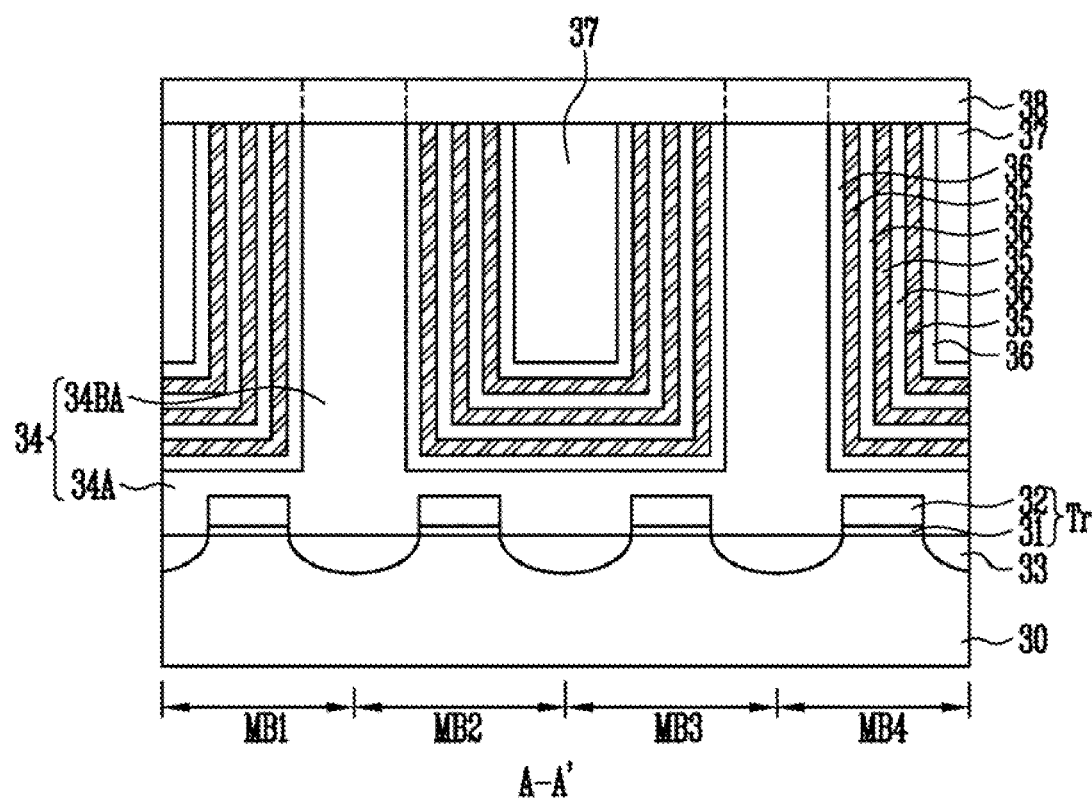
Figure 5C:
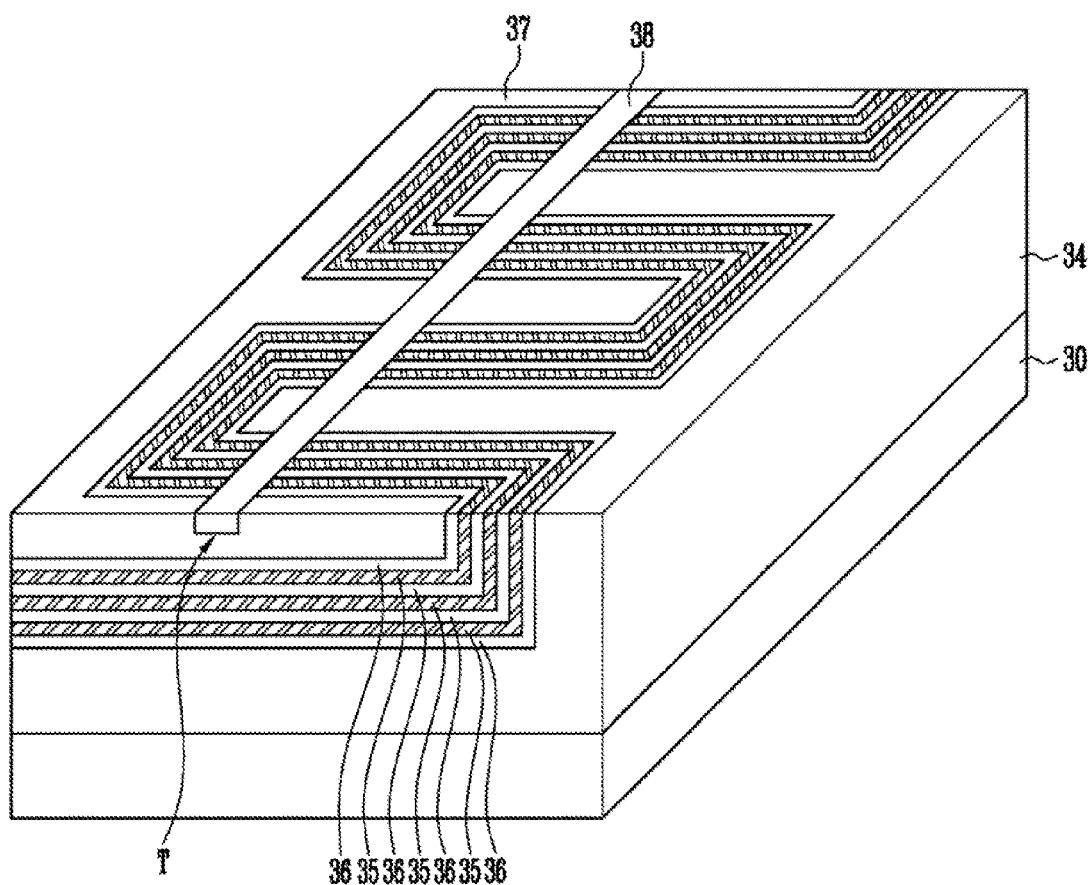

As illustrated in FIGS. 5A to 5C, after an interlayer insulating layer 37 is formed over the first and second material layers 35 and 36, a planarization process may be performed to expose a top surface of the support body 34. As a result, the first and second material layers 35 and 36 may be exposed along a top surface of an intermediate resultant structure.

Subsequently, at least one trench T may be formed in the top surfaces of the protrusions 34BA so that the trench T may overlap the second material layers 36. For example, the trench T may have a linear shape extending in a second direction II-II'. Subsequently, a support pattern 38 may be formed in the trench T. The support pattern 38 may include an insulating layer and be formed of the same material as the second material layers 36, so that the second material layers 36 may be coupled to the support pattern 38.

Figure 6A:
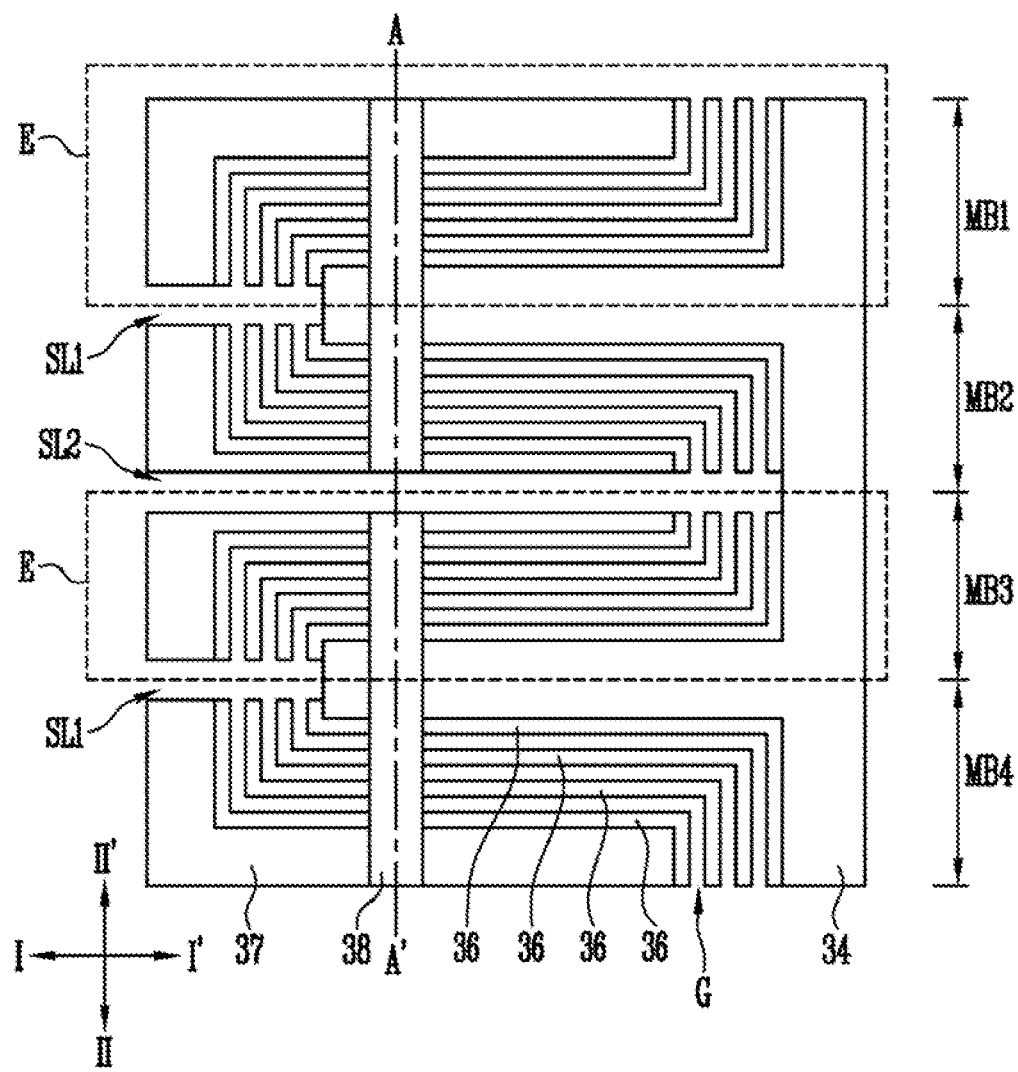
Figure 6B:
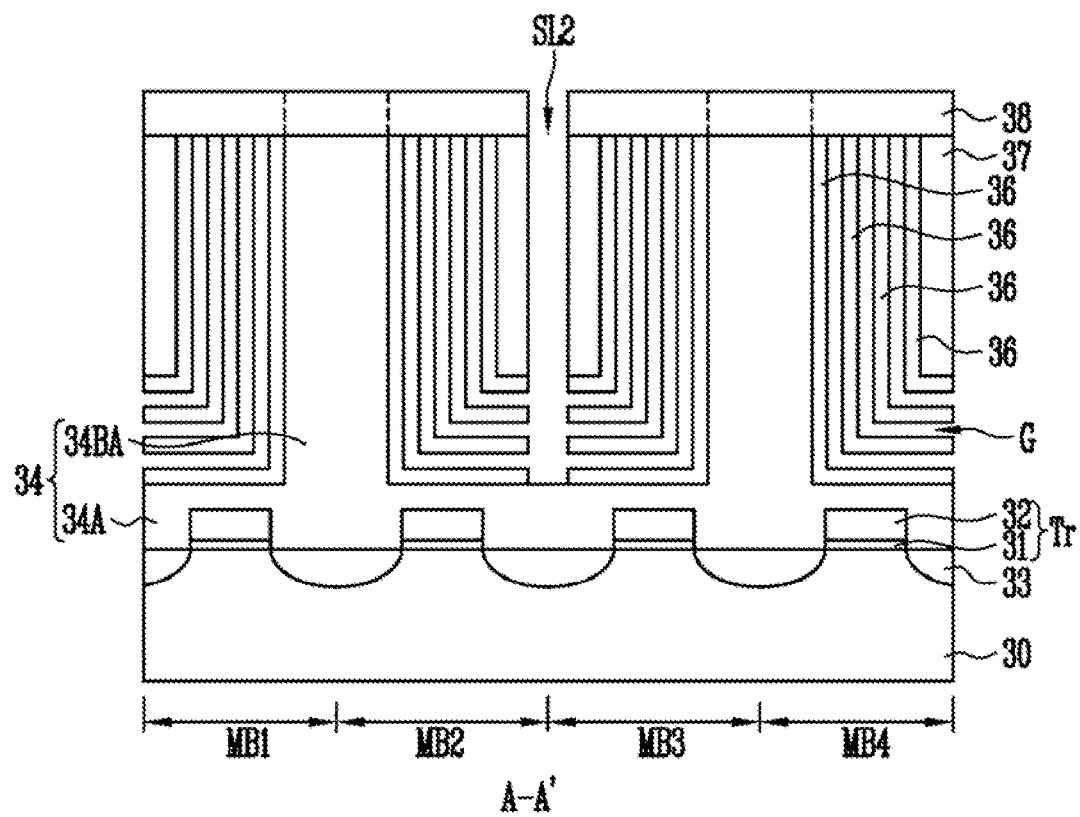
Figure 6C:
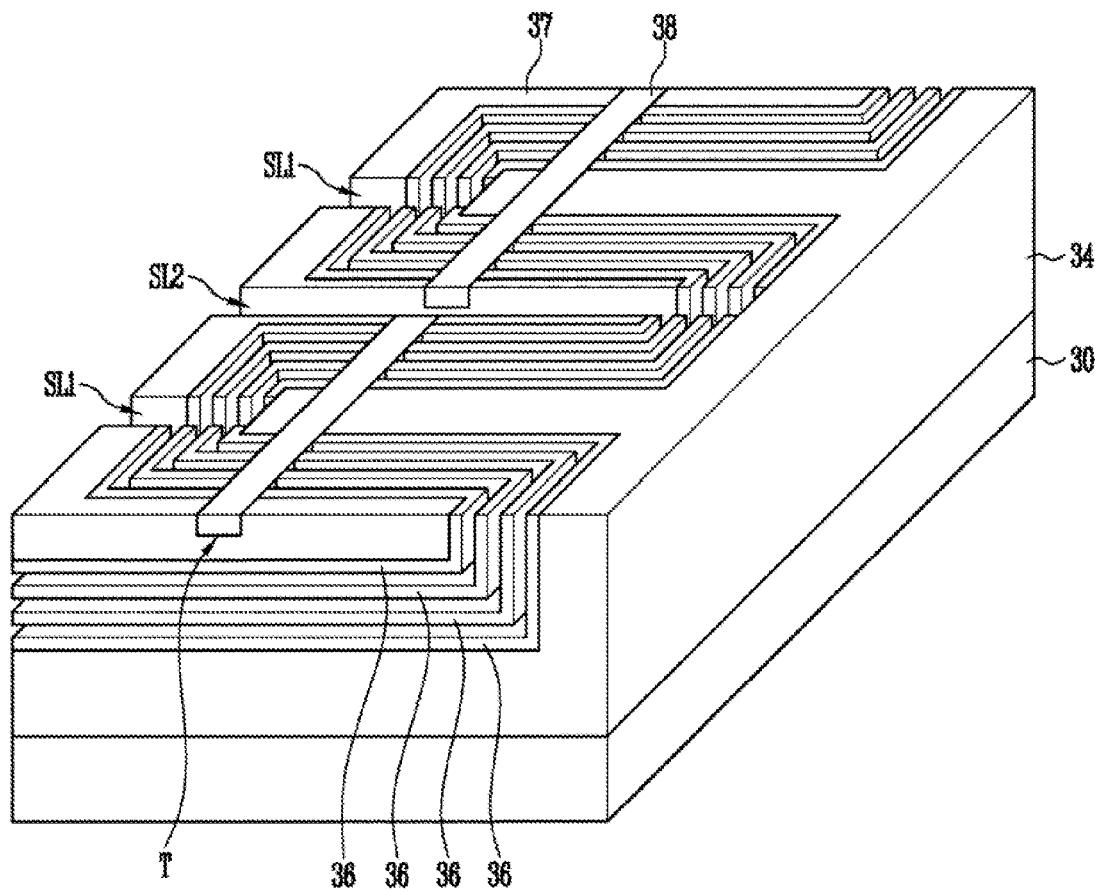

As illustrated in FIGS. 6A to 6C, the first and second material layers 35 and 36 may be divided into memory blocks MB1 to MB4. For example, the first and second slits SL1 and SL2 may be formed through the interlayer insulating layer 37, the first material layers 35 and the second material layers 36. The first and second slits SL1 and SL2 may be formed together with slits (not illustrated) located in the cell region. The cell region slits may be formed to pattern the first and second material layers 35 and 36 stacked in the cell region.

The first slits SL1 may be formed to separate the first and second material layers 35 and 36, stacked on top of one another while surrounding one protrusion 34BA. The first and second material layers 35 and 36, formed on one sidewall of the protrusion 34BA, and the first and second material layers 35 and 36, formed on the other sidewall of the protrusion 34BA, may be separated through the slits SL1. The second slits SL2 may be located at the boundary between the memory blocks MB2 and MB3, where the protrusion 34BA is not formed.

The first and second slits SL1 and SL2 may be located at boundaries between the neighboring memory blocks MB1 to MB4, and have depths deep enough to expose all of the first material layers 35. The first and second slits SL1 and SL2 may not be completely formed through the horizontal portion 34A, so that the first and second slits SL1 and SL2 may not expose the transistors Tr formed under the support body 34.

Each of the first and second slits SL1 and SL2 may have a linear shape extending in a first direction I-I'. In addition, the first and second slits SL1 and SL2 may have the same or different widths and lengths. In this embodiment, the description has been made in reference to an example in which the first and second slits SL1 and SL2 have the same widths, and the first slits SL1 are of a shorter length than the second slit SL2. However, the first slits SL1 may extend so as to pass through the support body 34. The first slits SL1 may have the same width as the protrusions 34BA, or a shorter width than the protrusions 34BA.

In addition, the first and second slits SL1 and SL2 may be formed simultaneously or separately. For example, after the second slits SL2 are formed, the first slits SL1 may be formed with insulating layers formed in the second slits SL2. Alternatively, the second slits SL2 and the insulating layers in the second slits SL2, may be formed before the support pattern 38 is formed.

Slits may be formed so that only the first and second material layers 35 and 36, formed on one set of sidewalls of the protrusions 34BA, may remain, while all the first and second material layers 35 and 36, formed on the other set of sidewalls of the protrusions 34BA, may be removed. For example, the first and second material layers 35 and 36, formed on one set of sidewalls (region E) of the protrusions 34BA, may remain, while the first and second material layers 35 and 36, formed on the other set of sidewalls of the protrusions 34BA, may be removed.

Subsequently, the first material layers 35, exposed through the first and second slits SL1 and SL2, may be removed to form a plurality of grooves G. Since the remaining second material layers 36 are coupled to the support pattern 38, the second material layers 36 may be prevented from being tilted or collapsed.

Figure 7A:
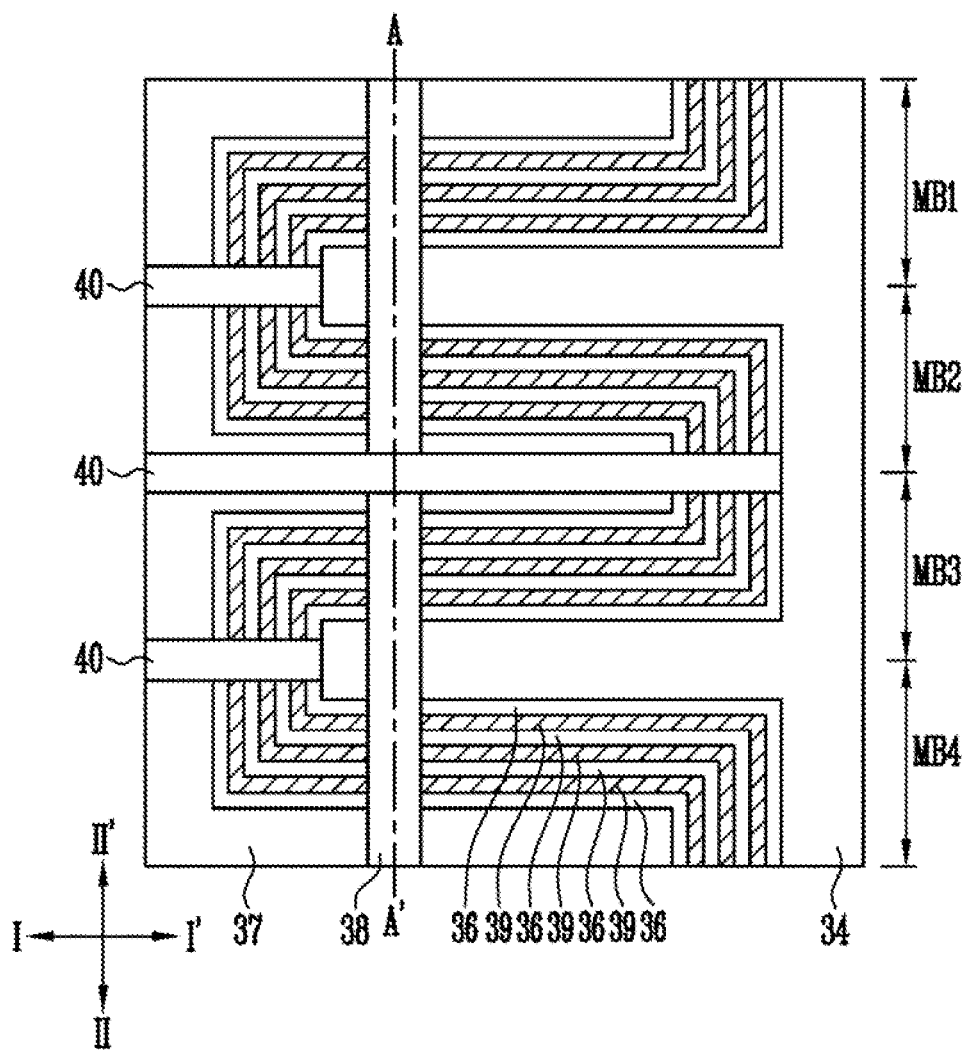
Figure 7B:
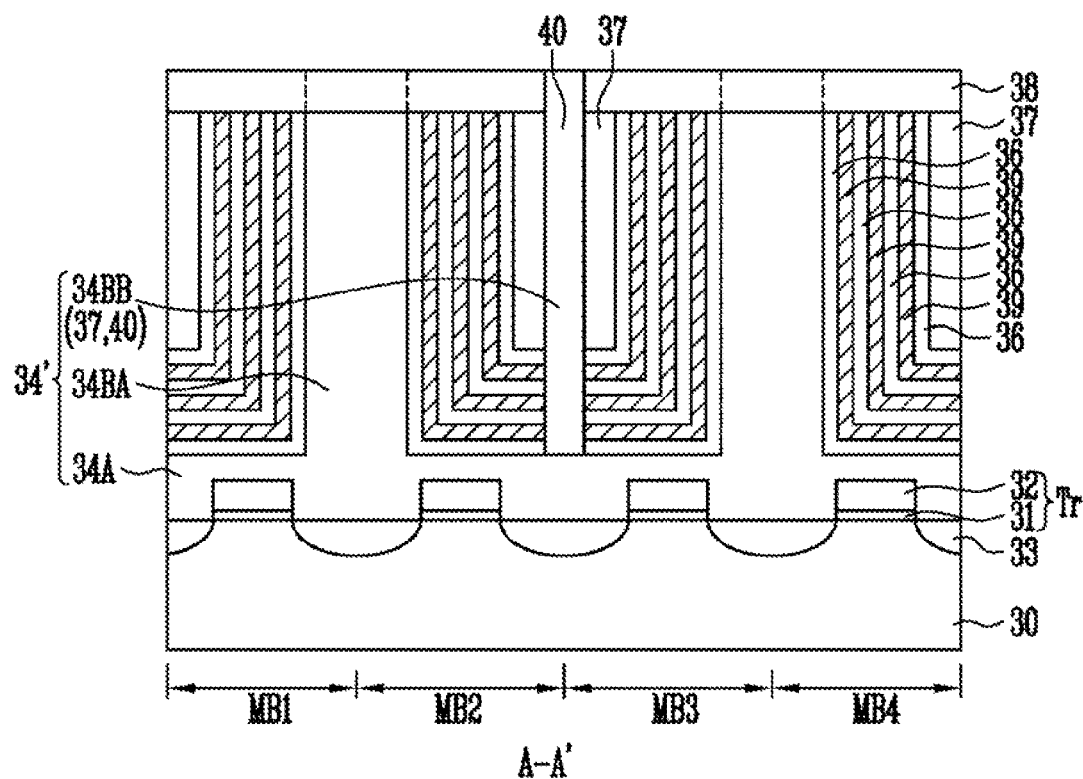
Figure 7C:
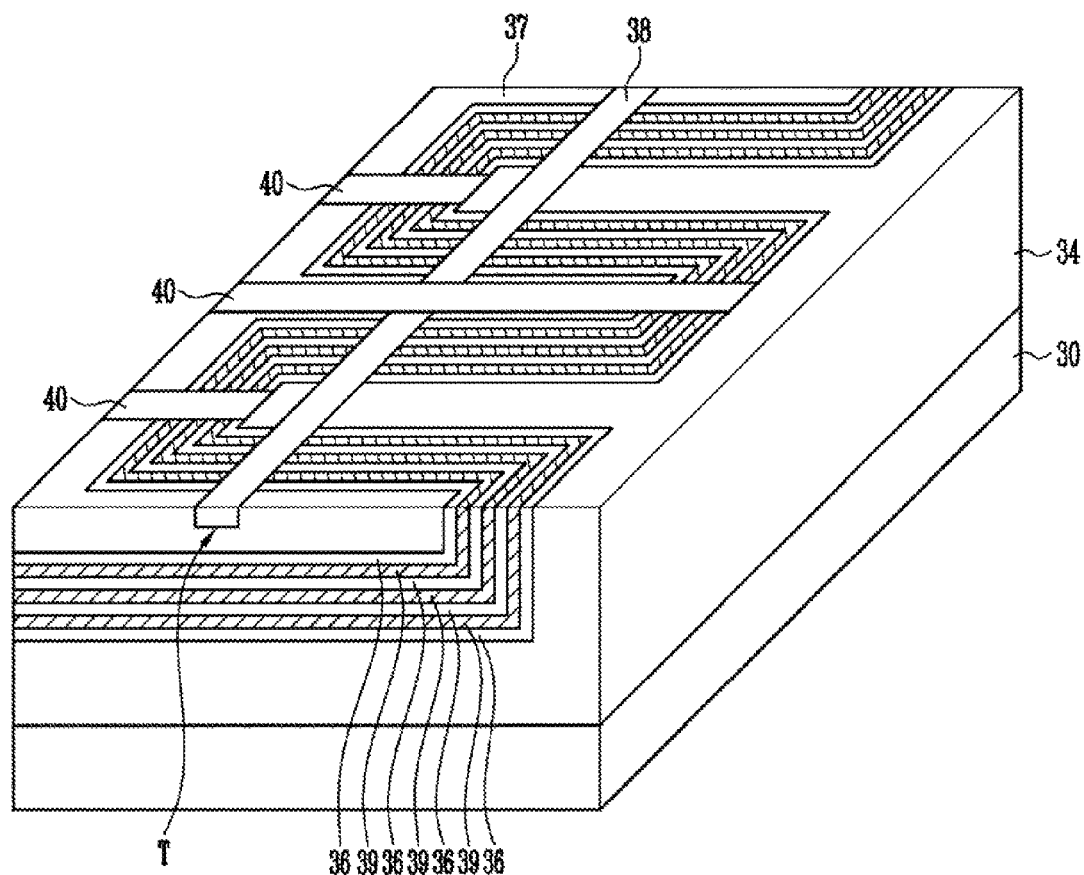

As illustrated in FIGS. 7A to 7C, a plurality of conductive layers 39 may be formed in the grooves G. Subsequently, insulating layers 40 may be formed in the first and second slits SL1 and SL2. An air gap may be formed in the first and second slits SL1 and SL2 by controlling deposition conditions of the insulating layers 40.

The insulating layer 40, formed in the first and second slits SL1 and SL2, may be coupled to the horizontal portion 34A and protrude from a top surface thereof. Therefore, the insulating layer 40, formed in the second slit SL2, and the insulating layer 37 coupled thereto may become the protrusion 34BB of a first support body 34'.

Figure 8A:
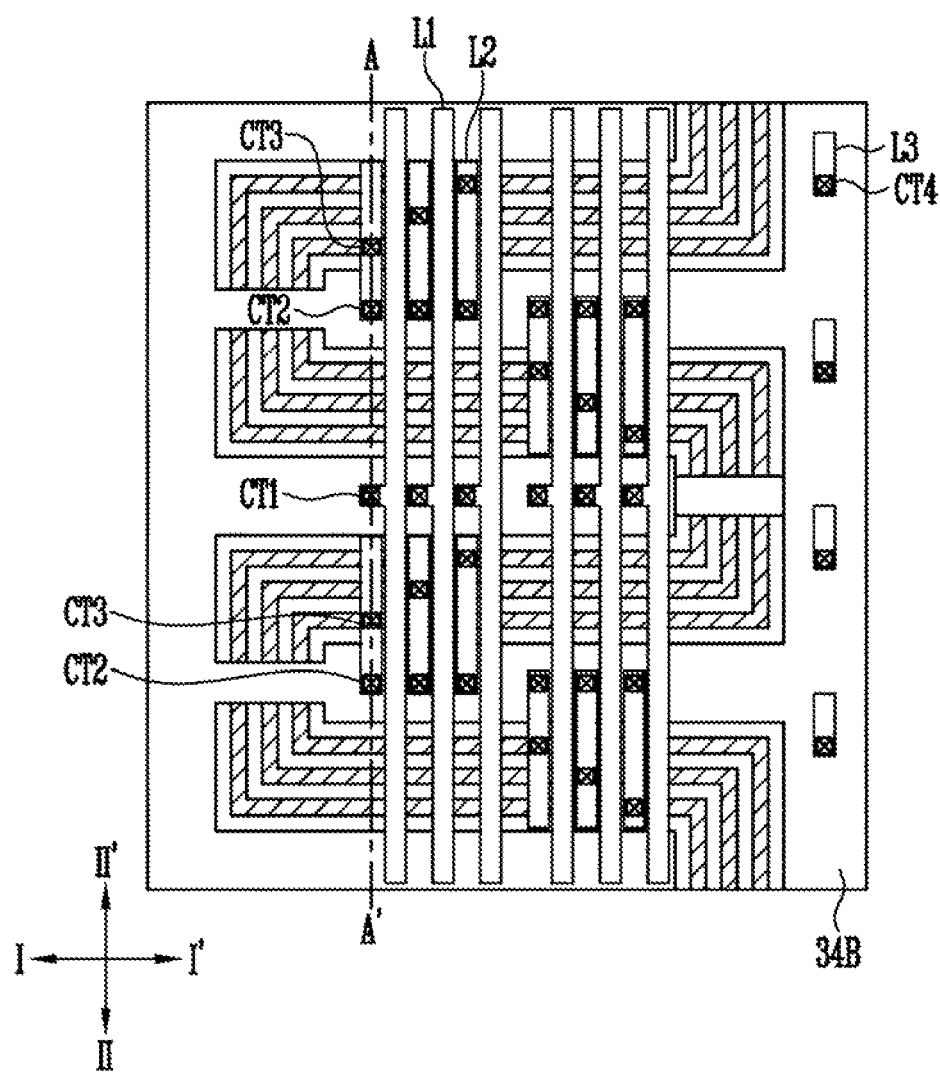
Figure 8B:
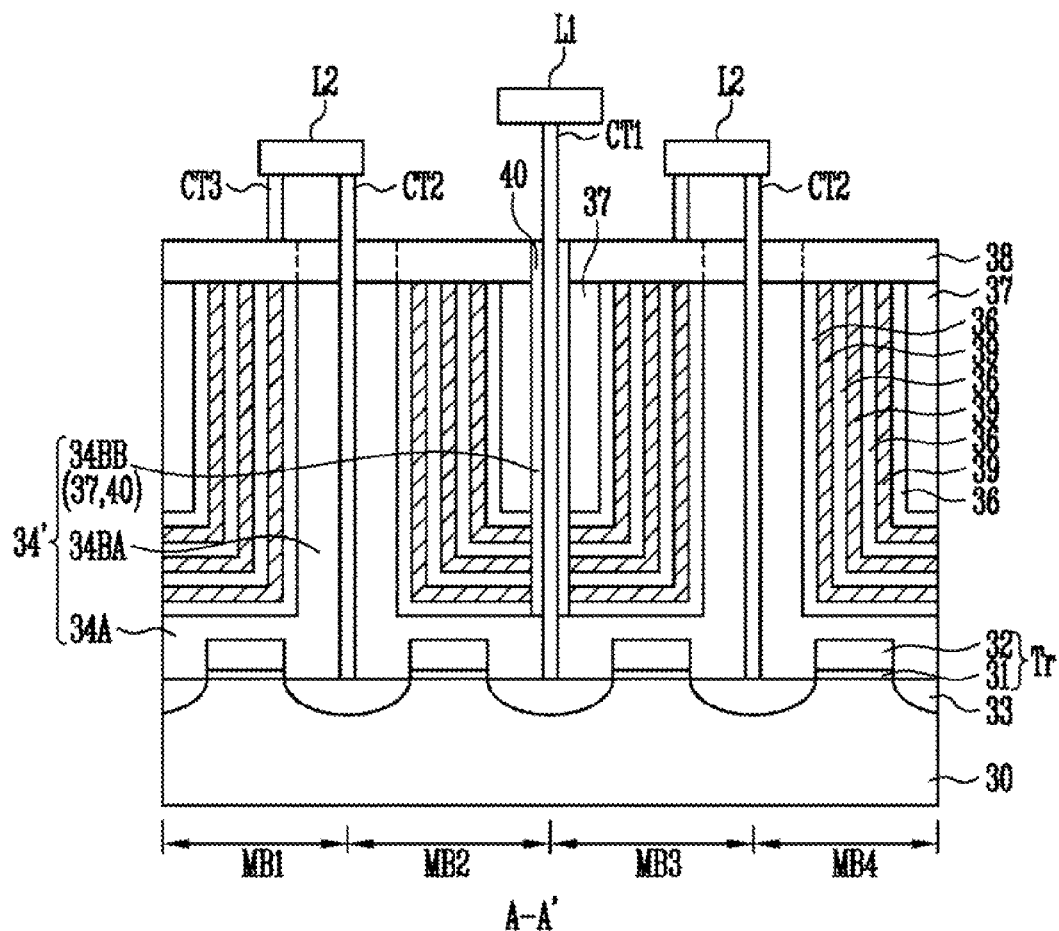
Figure 8C:
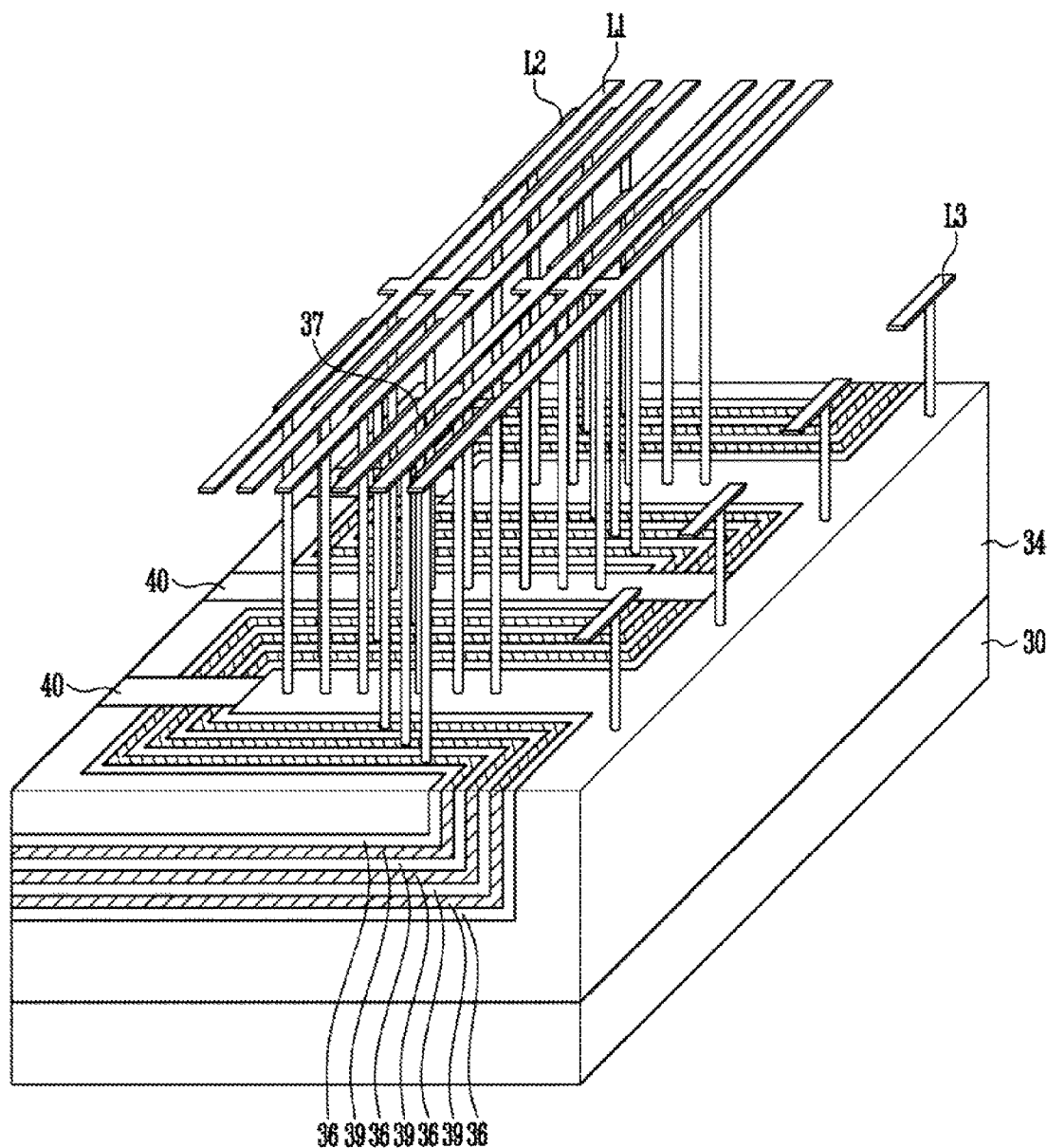

As illustrated in FIGS. 8A to 8C, the first to fourth contact plugs CT1 to CT4, and the first to third lines L1 to L3 may be formed. The first to fourth contact plugs CT1 to CT4 may be formed simultaneously or formed by separate processes, depending on etch depth. In addition, the first to third lines L1 to L3 may have the same or different lengths. In FIG. 8A, some layers, including the support pattern 38, are not depicted for illustration purposes.

The above-described manufacturing processes may be varied depending upon the types of the first and second material layers 35 and 36. For example, when the first material layers 35 are conductive layers, and the second material layers 36 are insulating layers, processes for forming the grooves G and the support pattern 38 may be omitted. Instead, a silicidation process may be performed on the first material layers 35 exposed through the first and second slits SL1 and SL2. In another example, when the first material layers 35 include conductive layers, and the second material layers 36 include sacrificial layers, the grooves G may be formed by removing the second material layers 36, instead of the first material layers 35, and insulating layers may be formed in the grooves G.

According to the aforementioned processes, pad portions may be defined at the top surfaces of the conductive layers 39, by stacking the conductive layers 39 using the protrusions 34BA. Therefore, it may be easier to define the pad portions without patterning the conductive layers 39 into a stepped structure. In addition, since the remaining second material layers 36 are supported by the support pattern 38, structural stability may be improved.

FIGS. 9A to 13A, 9B to 13B and 9C to 13C are views illustrating a method of manufacturing a semiconductor device according to another exemplary embodiment of the present invention. In each of the drawings, a contact region is mainly illustrated. FIGS. 9A to 13A are plan views, FIGS. 9B to 13B are cross-sectional views taken along line C-C' of FIGS. 9A to 13A, respectively, and FIGS. 9C to 13C are perspective views. Hereinafter, a description of common contents with the earlier described embodiment is omitted.

Figure 9B:
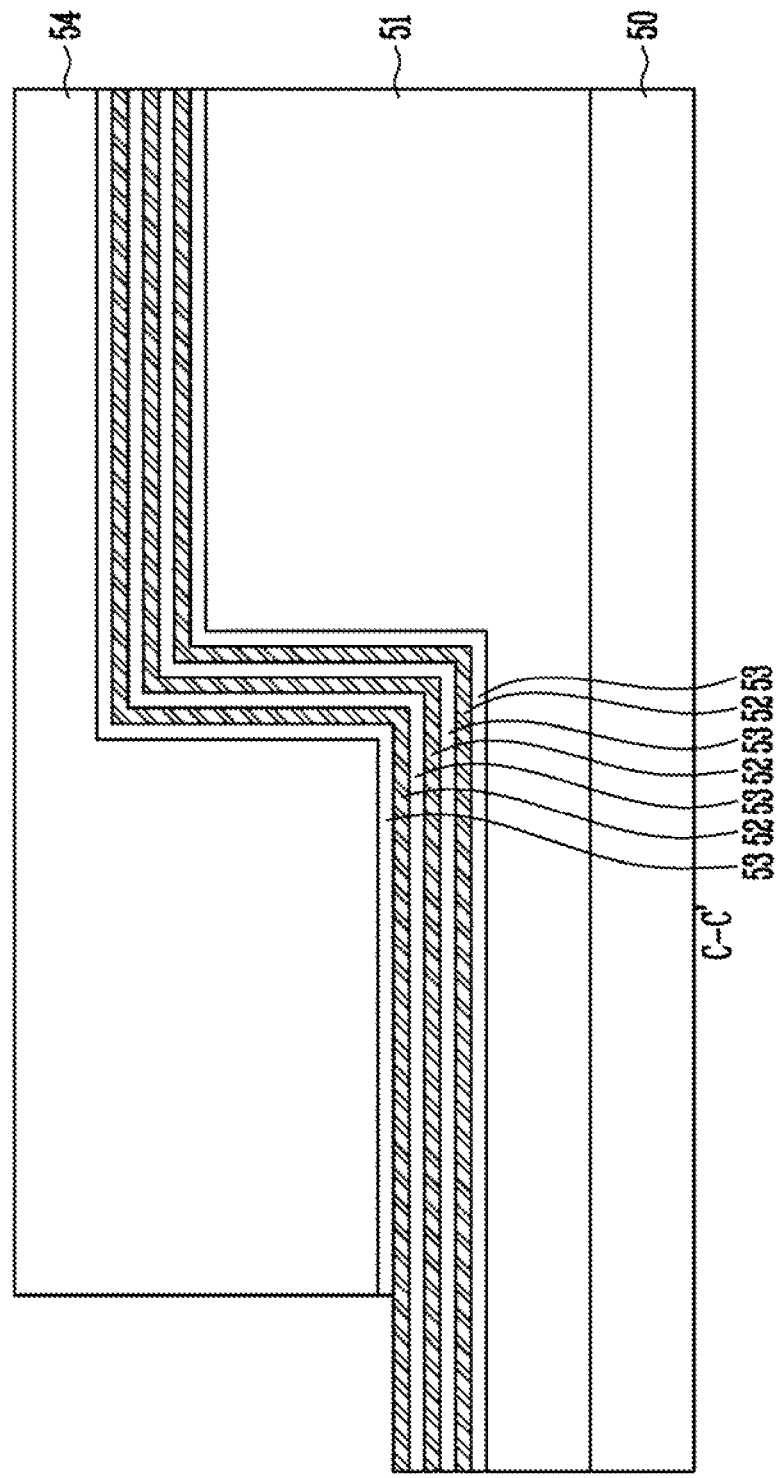

As illustrated in FIGS. 9A to 9C, a plurality of transistors (not illustrated) may be formed in first and second contact regions C1 and C2 of a substrate 50 that include first transistors, located in the first contact region C1, and second transistors, located in the second contact region C2. Gate electrodes of the first transistors and the second transistors, located in each one of the memory blocks MB1 to MB4, may be coupled to form a single gate pattern.

Subsequently, a first support body 51 may be formed to cover the plurality of transistors. The first support body 51 may include a first horizontal portion 51A, formed in the first and second contact regions C1 and C2, first protrusions 51BA, and a coupling portion 51C, located in the first contact region.

Subsequently, first material layers 52 and second material layers 53 may be alternately formed over the first support body 51. At this time, part of the first and second material layers to be finally provided may be formed. Since the plurality of transistors, the first support body 51, and the plurality of first and second material layers 52 and 53, are configured and manufactured in substantially the same manner as described above with reference to FIGS. 3A to 4G, a detailed description thereof will be omitted.

Thereafter, a second support body 54 that includes a second horizontal portion 54A and second protrusions 546A may be formed over the first and second material layers 52 and 53. For example, a material layer configured as a second support body may be formed over the first and second material layers 52 and 53, and the material layer configured as a second support body may subsequently be etched to form the second support body 54. When the material layer configured as the second support body is etched, the uppermost first material layer 52 may function as an etch stop layer.

The second horizontal portion 54A may cover the first and second material layers 52 and 53 formed in the first contact region C1. In addition, second protrusions 54BA may protrude from a sidewall of the second horizontal portion 54A and be located between a plurality of second transistors. For example, the second protrusions 54BA may be located at boundaries between neighboring memory blocks MB1 to MB4.

The width W1 and length L1 of the first protrusions 51BA may be the same or different from the width W2 and length L2 of the second protrusions 54BA. In addition, the centers of the first protrusions 51BA may coincide with the centers of the second protrusions 54BA, or the first protrusions 51BA may be aligned to be offset with the alignment of the second protrusions 54BA.

As illustrated in FIGS. 10A to 10C, first material layers 56 and second material layers 57 may be alternately formed over a resultant structure in which the second support body 54 is formed. The first and second material layers 56 and 57 may be formed over the second support body 54 in the first contact region C1 and over the first and second material layers 52 and in the second contact region C2. The first and second material layers 56 and 57, except for the first and second material layers 52 and 53, may be formed considering the number of final first and second material layers to be formed.

Although not illustrated in FIGS. 10A to 10C, a third support body may be formed over the first and second material layers 56 and 57. In other words, considering the number of word lines to be stacked, processes for forming a support body and first and second material layers may be repeated. For example, when n support bodies are used, first and second material layers may be formed n times.

Figure 11A:
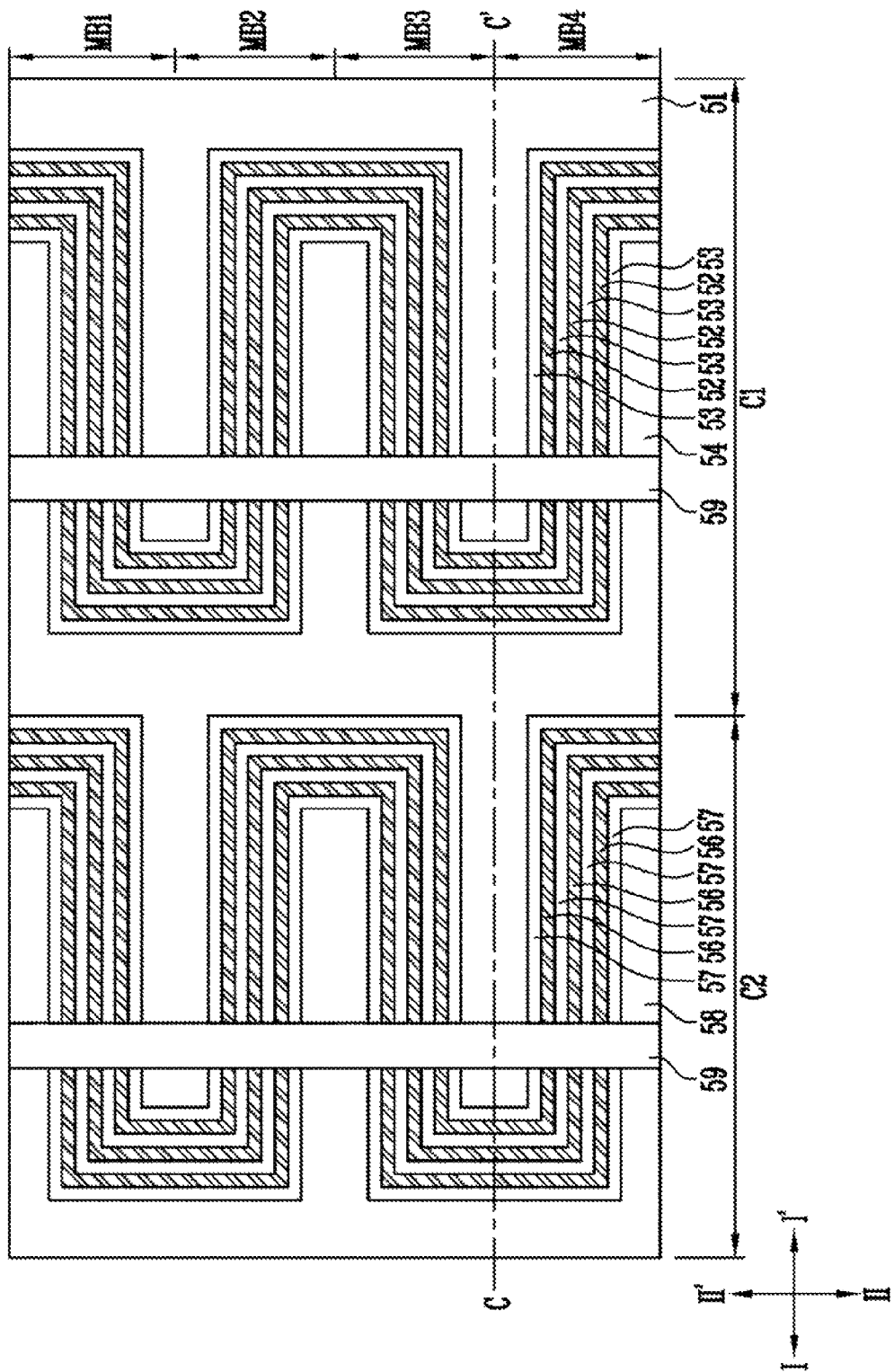

As illustrated in FIGS. 11A to 11C, an interlayer insulating layer 58 may be formed over the first and second material layers 56 and 57, and a planarization process may be performed until the top surfaces of the first protrusions 51BA are exposed. As a result, first and second material layers 52 and 53 may be exposed in the first contact region C1, and the first and second material layers 56 and 57 may be exposed in the second contact region C2.

Subsequently, at least one trench T may be formed in the top surfaces of the first and second protrusions 51BA and 54BA, and overlapping the second material layers 53 and 57. A support pattern 59 may be formed in the trench T.

Figure 12A:
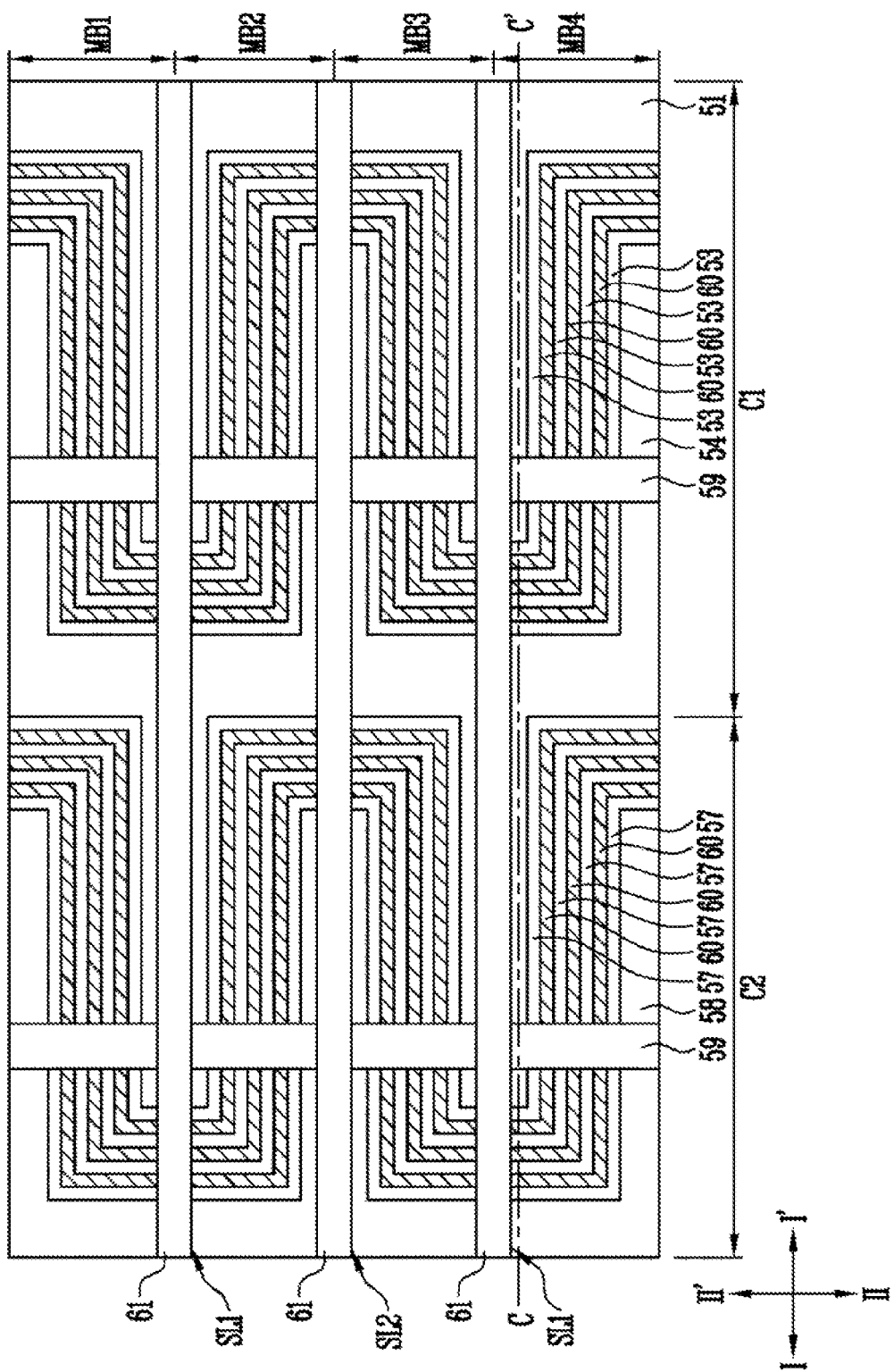

As illustrated in FIGS. 12A to 12C, the first and second material layers 52, 53, 56 and 57 may be divided into memory blocks MB1 to MB4. For example, the first and second slits SL1 and SL2 may be formed through the interlayer insulating layer 58, the first material layers 52 and 56, the second material layers 53 and 57, the first support body 51 and the second support body 54. The first and second slits SL1 and SL2 may have linear shapes extending in a first direction I-I'. The first and second slits SL1 and SL2 may extend up to the first protrusions 51BA or to the coupling portion 51C. For example, the first and second slits SL1 and SL2 of the first contact region C1 and the first and second slits SL1 and SL2 of the second contact region C2, may be separated from each other. In this example, the first and second slits SL1 and SL2 may not pass through the first and second protrusions 51BA and 54BA.

Subsequently, the first and second material layers 52 and 56, exposed through the first and second slits SL1 and SL2, may be removed to form a plurality of grooves. Conductive layers 60 may be formed in the grooves.

Subsequently, insulating layers 61 may be formed in the first and second slits SL1 and SL2. The insulating layers 61, formed in the first slits SL1 of the first contact region C1, may become the first protrusions 51BA. The insulating layer 61, formed in the second slit SL2 of the first contact region C1, may become the first protrusion 51BB. In addition, the insulating layers 61, which are formed in the first slits SL1 of the second contact region C2, may become the second protrusions 546A, and the insulating layer 61, which are formed in the second slit SL2 of the second contact region C2, may become the second protrusion 54BB.

Figure 13A:
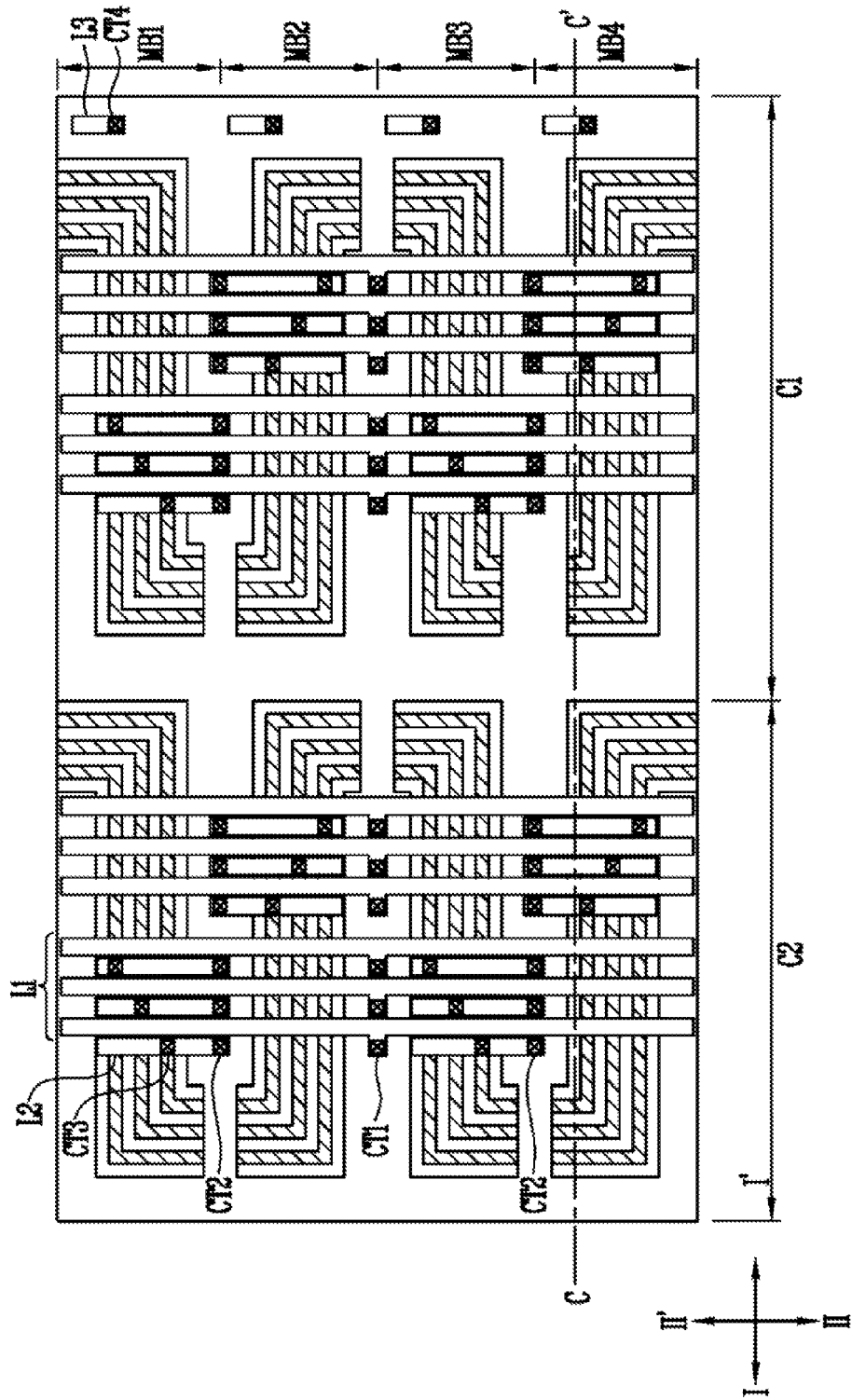

As illustrated in FIGS. 13A to 13C, the first to fourth contact plugs CT1 to CT4 and the first to third lines L1 to L3 may be formed. In FIG. 13C, some layers including the support pattern 59 are not depicted for illustration purposes.

The above-described manufacturing order may be partly changed. For example, before the second support body 54 is formed, the first and second material layers 52 and 53 may be planarized until surfaces of the first protrusions 51BA are exposed, and the first and second slits SL1 and SL2 may be formed. In addition, lower portions of the first and second contact plugs CT1 and CT2 that are coupled to the first contact region C1 may be formed before the second support body 54 is formed.

According to the above-described processes, pad portions of the conductive layers 60 may be dispersed in the first and second contact regions C1 and C2. Therefore, a degree of integration for the semiconductor device may be improved by increasing the number of conductive layers 60 to be stacked.

Figure 14:
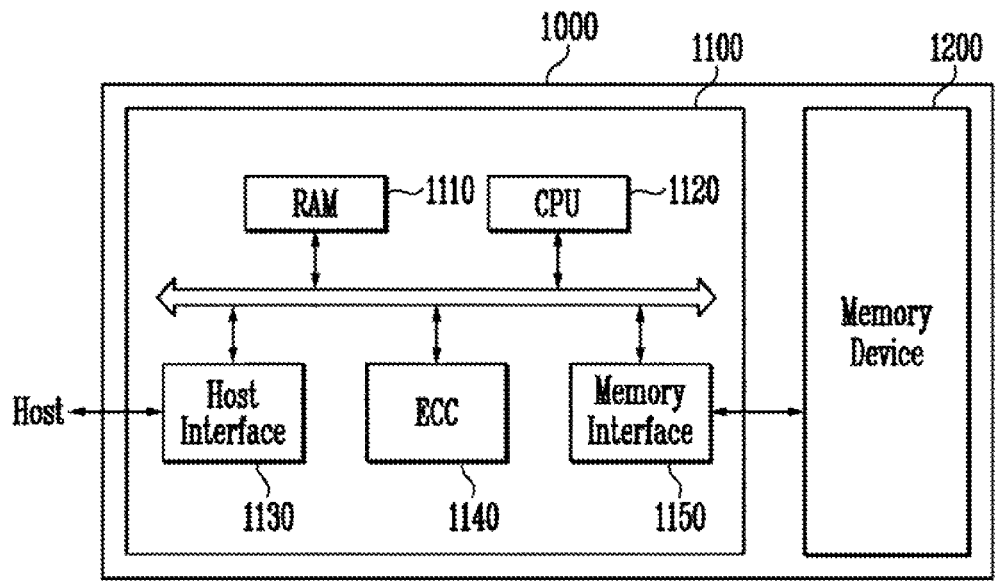
FIG. 14 is a block diagram of the configuration of a memory system according to an exemplary embodiment of the present invention.

FIG. 14 is a block diagram of the configuration of a memory system according to an exemplary embodiment of the present invention.

As illustrated in FIG. 14, a memory system 1000 according to an exemplary embodiment of the present invention may include a memory device 1200 and a controller 1100.

The memory device 1200 may be used to store data information having various data types, such as text, graphic and software code. The memory device 1200 may be a nonvolatile memory, or a semiconductor device described above with reference to FIGS. 1A to 13C. In addition, the memory device 1200 may include a plurality of transistors that are formed over a substrate; a support body that includes a horizontal portion covering the plurality of transistors and protruding portions formed over the horizontal portion located between the plurality of transistors; and conductive layers and insulating layers that are alternately stacked over the support body and protrude upwardly along the sidewalls of the protruding portions. Since the memory device 1200 is configured and manufactured in the above-described manner, a detailed description thereof will be omitted.

The controller 1100 may be coupled to a host and the memory device 1200 and is configured to access the memory device 1200 in response to a request from the host. For example, the controller 1100 may be configured to control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1110, a cache memory between the memory device 1200 and the host, and a buffer memory between the memory device 1200 and the host. The RAM 1110 may be replaced by a static random access memory (SRAM) or a read only memory (ROM).

The CPU 1120 may be configured to control the general operation of the controller 1100. For example, the CPU 1120 may be configured to operate firmware such as a flash translation layer (FTL) stored in the RAM 1110.

The host interface 1130 may be configured to interface with the host. For example, the controller 1100 may communicate with the host through one of various interface protocols, including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The ECC circuit 1140 may be configured to detect and correct errors included in data read from the memory device 1200 by using error correction codes (ECCs).

The memory interface 1150 may be configured to interface with the memory device 1200. For example, the memory interface 1150 may include a NAND interface or a NOR interface.

The controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may include ROM storing code data to interface with the host.

As described above, since the memory system 1000 according to an exemplary embodiment of the present invention includes the memory device 1200 that has structural stability, allows for easy manufacture and has improved degree of integration, data storage capacity of the memory system 1000 may be increased.

Figure 15:
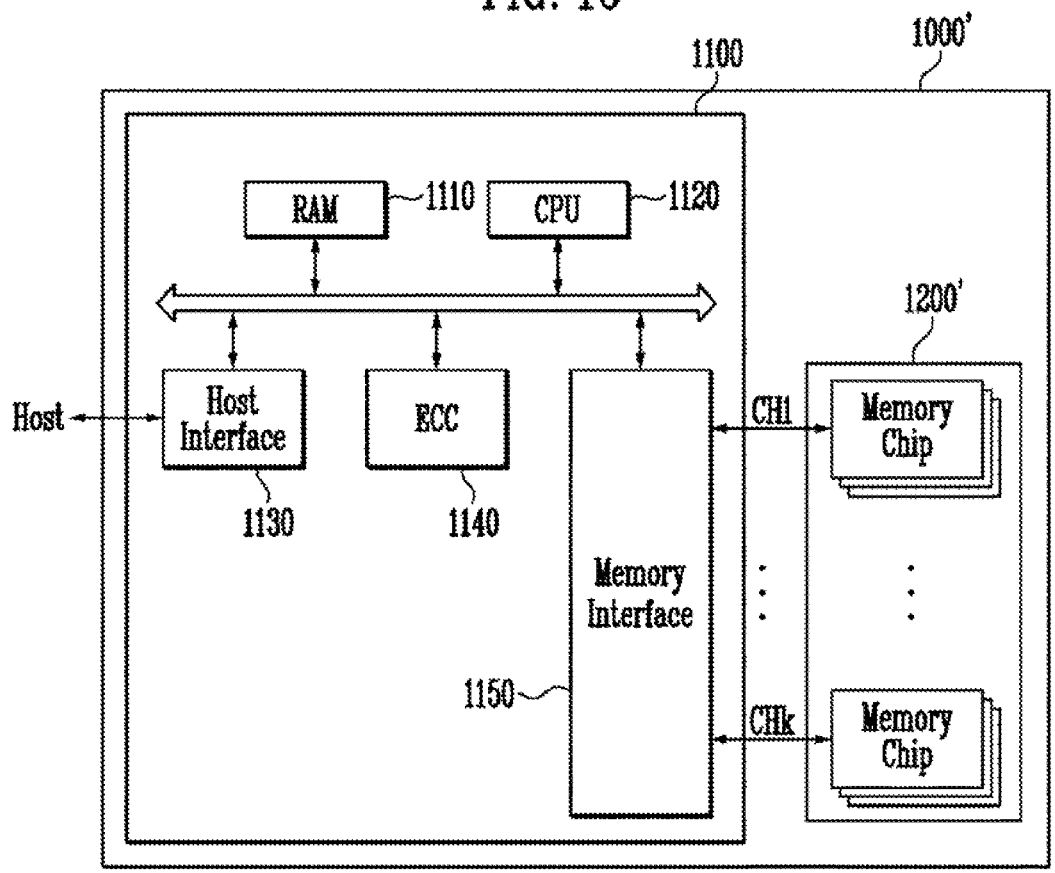
FIG. 15 is a block diagram of the configuration of a memory system according to an exemplary embodiment of the present invention.

FIG. 15 is a block diagram of the configuration of a memory system according to another exemplary embodiment of the present invention. Hereinafter, a description of common contents with the earlier described embodiment is omitted.

As illustrated in FIG. 15, a memory system 1000' according to an exemplary embodiment of the present invention may include a memory device 1200' and the controller 1100. As noted previously, the controller 1100 may include the RAM 1110, the CPU 1120, the host interface 1130, the ECC circuit 1140 and the memory interface 1150.

The memory device 1200' may be a non-volatile memory device, or a semiconductor device described above with reference to FIGS. 1A to 13C. In addition, the memory device 1200' may include a plurality of transistors that are formed over a substrate; a support body that includes a horizontal portion covering the plurality of transistors and protruding portions formed over the horizontal portion located between the plurality of transistors; and conductive layers and insulating layers that are alternately stacked over the support body and protruding upwardly along sidewalls of the protruding portions. Since the memory device 1200' is configured and manufactured in the above-described manner, a detailed description thereof will be omitted.

In addition, the memory device 1200' may be a multi-chip package composed of a plurality of memory chips that are divided into a plurality of groups, which may be configured to communicate with the controller 1100 through first to k-th channels CH1 to CHk. In addition memory chips, included in a single group, may be configured to communicate with the controller 1100 through a common channel. The memory system 1000' may be modified so that a single memory chip may be coupled to a single channel.

As described above, since the memory system 1000' according to an exemplary embodiment of the present invention includes the memory device 1200' that has structural stability, allows for easy manufacture and has improved degree of integration, data storage capacity of the memory system 1000' may be increased. Particularly, since the memory system 1200' includes a multi-chip package, the data storage capacity and driving speed of the memory system 1000' may be further increased.

Figure 16:
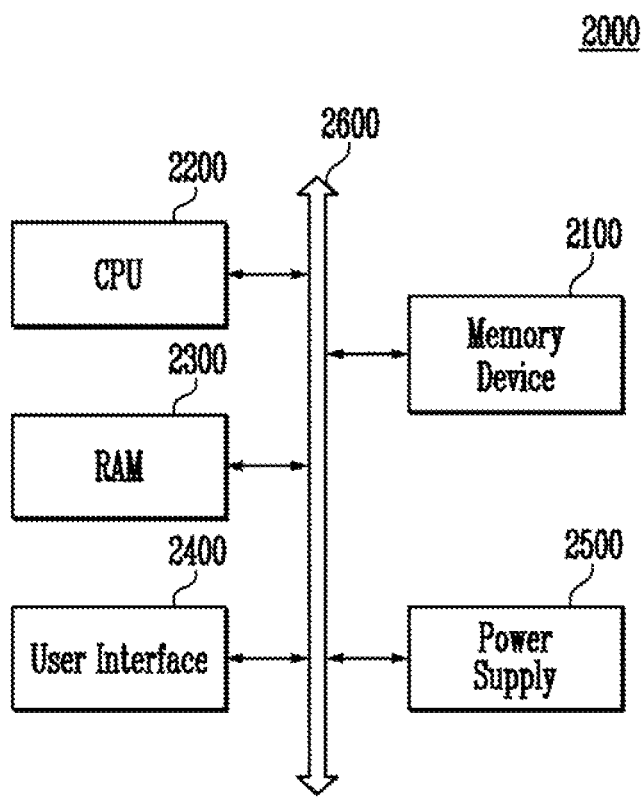
FIG. 16 is a block diagram of the configuration of a computing system according to an exemplary embodiment of the present invention.

FIG. 16 is a block diagram of the configuration of a computing system according to an exemplary embodiment of the present invention. Hereinafter, a description of common contents with the earlier described embodiments is omitted.

As illustrated in FIG. 16, a computing system 2000 according to an exemplary embodiment of the present invention may include a memory device 2100, a CPU 2200, random-access memory (RAM) 2300, a user interface 2400, a power supply 2500, and a system bus 2600.

The memory device 2100 may store data provided through the user interface 2400 and data processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 directly or through a controller (not illustrated). When the memory device 2100 is directly coupled to the system bus 2600, functions of the controller may be performed by the CPU 2200 and the RAM 2300.

The memory device 2100 may be a non-volatile memory, or a semiconductor device described above with reference to FIGS. 1A to 13C. The memory device 2100 may include a plurality of transistors that are formed over a substrate; a support body that includes a horizontal portion covering the plurality of transistors and protruding portions formed over the horizontal portion located between the plurality of transistors; and conductive layers and insulating layers that are alternately stacked over the support body and protruding upwardly along sidewalls of the protruding portions. Since the memory device 2100 is configured and manufactured in the above-described manner, a detailed description thereof will be omitted.

In addition, as described above with reference to FIG. 15, the memory device 2100 may be a multi-chip package composed of a plurality of memory chips.

The computing system 2000 having the above-described configuration may be one of various components of an electronic device, such as a computer, an ultra-mobile PC (UMPC), a workstation, a notebook, personal digital assistants (PDAs), a portable computer, a web tablet, a wireless phone, a mobile phone, a smartphone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, since the memory system 2000 according to an exemplary embodiment of the present invention includes the memory device 2100 that has structural stability, allows for easy manufacture and has improved degree of integration, data storage capacity of the memory system 1000 may be increased.

Figure 17:
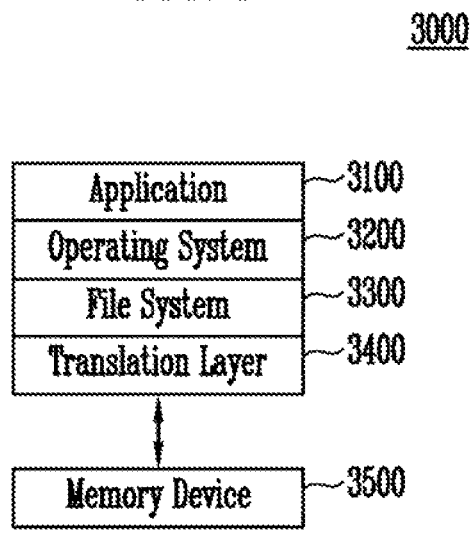
FIG. 17 is a block diagram of a computing system according to an exemplary embodiment of the present invention.

FIG. 17 is a block diagram of a computing system according to another exemplary embodiment of the present invention.

As illustrated in FIG. 17, a computing system 3000 according to an exemplary embodiment of the present invention may include a software layer that has an operating system 3100, an application 3200, a file system 3300, and a translation layer 3400. In addition, the computing system 3000 may include a hardware layer such as a memory system 3500.

The file system 3300 may refer to a logical structure configured to manage data and files present in the computing system 3000. The file system 3300 may organize files or data to be stored in the memory device 3500 according to rules. The file system 3300 may be determined according to the operating system 3100 which is used in the computing system 3000. For example, when the operating system 3100 is Microsoft Windows, the file system 3300 may be a file allocation table (FAT) or an NT file system (NTFS). In addition, when the operating system 3100 is Unix/Linux, the file system 3300 may be an extended file system (EXT), a Unix file system (UFS) or a journaling file system (JFS).

FIG. 17 illustrates the operating system 3100, the application 3200 and the file system 3300 in separate blocks. However, the application 3200 and the file system 3300 may be included in the operating system 3100.

The translation layer 3400 may translate an address so as to be suitable for the memory device 3500 in response to a request from the file system 3300. For example, the translation layer 3400 may translate a logic address, generated by the file system 3300, into a physical address of the memory device 3500. Mapping address of the logic address and the physical address may be stored in an address translation table. For example, the translation layer 3400 may be a flash translation layer (FTL), a universal flash storage link layer (ULL) or the like.

The memory device 3500 may be a non-volatile memory, or a semiconductor device described above with reference to FIGS. 1A to 13C. In addition, the memory device 3500 may include a plurality of transistors that are formed over a substrate; a support body that includes a horizontal portion covering the plurality of transistors and protruding portions formed over the horizontal portion located between the plurality of transistors; and conductive layers and insulating layers alternately stacked over the support body and protruding upwardly along sidewalls of the protruding portions. Since the memory device 3500 is configured and manufactured in the above-described manner, a detailed description thereof will be omitted.

The computing system 3000 having the above-described configuration may be divided into an operating system layer that operates in an upper layer region and a controller layer that operates in a lower level region. The application 3100, the operating system 3200 and the file system 3300 may be included in the operating system layer and driven by an operation memory. In addition, the translation layer 3400 may be included in the operating system layer or the controller layer.

As described above, since the computing system 3000 according to an exemplary embodiment of the present invention includes the memory device 3500 having a simplified method and an improved degree of integration, data storage capacity of the computing system 3000 may be improved.

Since the conductive layers are stacked using support body, they may protrude upwardly. Therefore, it may be easier to manufacture a semiconductor device. In addition, since the switch devices are located under pad portions of the conductive layers, a degree of integration of the semiconductor device may be improved.

What is claimed is:

1. A semiconductor device, comprising:
a plurality of transistors formed over a substrate;
a support body formed on the transistors and including a horizontal portion and protrusions, wherein the horizontal portion covers at least one of the transistors, and the protrusions protruded from an upper surface of the horizontal portion and located between the transistors;
conductive layers and insulating layers alternately stacked over the support body;
first and second junctions of the transistors;
a plurality of first lines coupled to the first junctions of the transistors, respectively; and
a plurality of second lines coupling the conductive layers to the second junctions of the transistors, respectively.
wherein the conductive layers include pad portions bent upwardly along sidewalls of the protrusions, and
wherein the transistors are located below the pad portions of the conductive layers.

2. The semiconductor device of claim 1, wherein the protrusions are located between neighboring memory blocks.

3. The semiconductor device of claim 1, further comprising:
a plurality of first contact plugs passing through the protrusions and coupling the first junctions to the first lines, respectively;
a plurality of second contact plugs passing through the protrusions and coupling the second junctions to the second lines, respectively; and
a plurality of third contact plugs coupling the conductive layers to the second lines, respectively.

4. The semiconductor device of claim 1, wherein the first and second lines are formed over the conductive layers and the insulating layers.

5. The semiconductor device of claim 1, wherein the protrusions extend in a first direction, and the first and second lines extend in a second direction crossing the first direction.

6. The semiconductor device of claim 1, further comprising:

at least one trench formed in the top surface of one of the protrusions and overlapping one of the insulating layers; and at least one support pattern formed in the trench and coupled to one of the insulating layers.

7. A method of manufacturing a semiconductor device, comprising the steps of:
forming a plurality of first transistors located in a first contact region of a substrate;
forming a first support body on the first transistors including a first horizontal portion and first protrusions, wherein the first horizontal portion covers at least one of the first transistors, and the first protrusions protruded from an upper surface of the first horizontal portion and located between the first transistors;
alternately stacking a plurality of first conductive layers and a plurality of first insulating layers over the first support body,
wherein steps of forming the first conductive layers and the first insulating layers comprises:
alternately forming a plurality of first material layers and a plurality of second material layers over the first support body and
forming slits through which the first material layers and the second material layers are divided into memory blocks;
forming a plurality of first contact plugs passing through the first protrusions and coupled to the first junctions of the first transistors, respectively;
forming a plurality of second contact plugs passing through the slits and coupled to the second junctions of the first transistors, respectively;
forming a plurality of third contact plugs coupled to the first conductive layers, respectively;
forming first lines coupled to the first contact plugs, respectively; and
forming second lines coupling the second contact plugs to third contact plugs, respectively,
wherein the first conductive layers include pad portions bent upwardly along sidewalls of the first protrusions, and
wherein the first transistors are located below the pad portions of the first conductive layers.

8. The method of claim 7, wherein the step of forming the first conductive layers and the first insulating layers further comprises:
alternately forming a plurality of first material layers and a plurality of second material layers over the first support body;
forming at least one trench in the top surface of one of the first protrusions so that the trench overlaps one of the second material layers;
forming at least one support pattern in the trench for coupling to one of the second material layers;
forming at least one groove by removing a first material layer; and
forming the first conductive layer in the groove.

9. The semiconductor device of claim 1, wherein the transistors are formed on a contact region of the substrate, the horizontal portion covers a cell region and the contact region of the substrate, and the protrusions are formed on the contact region of the substrate.

10. The method of claim 7, wherein the first horizontal portion covers a cell region and the first contact region of the substrate, and the first protrusions are formed on the first contact region of the substrate.

11. A semiconductor device, comprising:
switch transistors including first and second junctions;
a support body formed on the switch transistors and including a horizontal portion and protrusions, wherein the horizontal portion covers at least one of the switch transistors, and the protrusions protruded from an upper surface of the horizontal portion and located over the first and second junctions;
word lines and insulating layers alternately stacked over the support body and bent upwardly along sidewalls of the protrusions;
global word lines formed on the word lines;
local word lines formed on the word lines;
first contact plugs passing through the protrusions and coupling the global word lines to the first junctions, respectively;
second contact plugs passing through the protrusions and coupling the second junctions to the local word lines, respectively; and
third contact plugs coupling the word lines to the local word lines, respectively.

* * * * *